US012706158B2

(12) United States Patent
Li et al.

(10) Patent No.: US 12,706,158 B2
(45) Date of Patent: Aug. 11, 2026

(54) ENABLE OPEN SUB-BLOCK ERASE IN SUB-BLOCK MODE OPERATION

(71) Applicant: Sandisk Technologies, Inc., Milpitas, CA (US)

(72) Inventors: Weiyi Li, Fremont, CA (US); Jiacen Guo, Cupertino, CA (US); Xiang Yang, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 152 days.

(21) Appl. No.: 18/883,214

(22) Filed: Sep. 12, 2024

(65) Prior Publication Data

US 2026/0073992 A1 Mar. 12, 2026

(51) Int. Cl.

| | |
|---|---|
| ***G11C 16/04*** | (2006.01) |
| ***G11C 16/16*** | (2006.01) |
| *H10W 90/00* | (2026.01) |
| *H10W 90/24* | (2026.01) |

(52) U.S. Cl.

CPC .......... *G11C 16/16* (2013.01); *G11C 16/0483* (2013.01); *H10W 90/00* (2026.01); *H10W 90/24* (2026.01)

(58) Field of Classification Search

CPC ... G11C 16/16; G11C 16/0483; H10W 90/00; H10W 90/24

USPC .................................................... 365/185.11

See application file for complete search history.

(56) References Cited

U.S. PATENT DOCUMENTS

| | | | | |
|---|---|---|---|---|
| 8,909,493 | B2 | 12/2014 | Avila et al. | |
| 8,964,481 | B2 * | 2/2015 | Oh | G11C 16/16 365/185.11 |
| 10,658,043 | B2 * | 5/2020 | Shim | G11C 7/1039 |
| 10,712,954 | B2 * | 7/2020 | Kim | G11C 5/143 |
| 11,037,635 | B1 | 6/2021 | Lien et al. | |
| 11,335,410 | B2 | 5/2022 | Hwang et al. | |
| 11,749,353 | B2 | 9/2023 | Kavalipurapu et al. | |
| 11,798,625 | B2 | 10/2023 | Yang et al. | |
| 11,894,064 | B2 | 2/2024 | Yang | |
| 2024/0161858 | A1 | 5/2024 | Amin et al. | |

* cited by examiner

*Primary Examiner* — Tha-O H Bui

(74) *Attorney, Agent, or Firm* — Dickinson Wright PLLC

(57) ABSTRACT

A memory apparatus and operating method are provided. The apparatus includes memory cells connected to word lines and configured to retain a threshold voltage corresponding to data states. The memory cells form a block including an unselected sub-block for an erase operation and a selected sub-block for the erase operation. A control means is configured to identify ones of the word lines of the unselected sub-block that are programmed. The control means applies a selected erase enable voltage to ones of the word lines of the selected sub-block while applying an unselected erase enable voltage to ones word lines of the unselected sub-block to erase the memory cells of the selected sub-block during the erase operation. The unselected erase enable voltage is different for ones of the word lines of the unselected sub-block that are programmed than for ones of the word lines of the unselected sub-block that are erased.

20 Claims, 22 Drawing Sheets

ENABLE OPEN SUB-BLOCK ERASE IN SUB-BLOCK MODE OPERATION

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-trapping material can be used in such memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

Each memory cell includes the charge-trapping material and may be programmed to store an amount of charge which represents a data state. The memory cells may be arranged in strings or memory holes, for instance, where select gate transistors are provided at the ends of the string to selectively connect a channel of the string to a source line or bit line. However, various challenges are presented in operating such memory devices.

SUMMARY

This section provides a general summary of the present disclosure and is not a comprehensive disclosure of its full scope or all of its features and advantages.

An object of the present disclosure is to provide a memory apparatus and a method of operation of the memory apparatus that address and overcome shortcomings described herein. Accordingly, it is an aspect of the present disclosure to provide a memory apparatus including memory cells each connected to one of a plurality of word lines and configured to retain a threshold voltage corresponding to one of a plurality of data states. The memory cells form a block including an unselected sub-block for an erase operation and a selected sub-block for the erase operation. The memory apparatus also includes a control means configured to identify ones of the plurality of word lines of the unselected sub-block that are programmed. The control means is also configured to apply a selected erase enable voltage to ones of the plurality of word lines of the selected sub-block while applying an unselected erase enable voltage to ones of the plurality of word lines of the unselected sub-block to erase the memory cells of the selected sub-block during the erase operation. The unselected erase enable voltage is different for ones of the plurality of word lines of the unselected sub-block that are programmed than for ones of the plurality of word lines of the unselected sub-block that are erased.

According to another aspect of the disclosure, a controller in communication with a memory apparatus including memory cells each connected to one of a plurality of word lines is also provided. The memory cells are configured to retain a threshold voltage corresponding to one of a plurality of data states. The memory cells form a block including an unselected sub-block for an erase operation and a selected sub-block for the erase operation. The controller is configured to identify ones of the plurality of word lines of the unselected sub-block that are programmed. The controller is also configured to instruct the memory apparatus to apply a selected erase enable voltage to ones of the plurality of word lines of the selected sub-block while applying an unselected erase enable voltage to ones of the plurality of word lines of the unselected sub-block to erase the memory cells of the selected sub-block during the erase operation. The unselected erase enable voltage is different for ones of the plurality of word lines of the unselected sub-block that are programmed than for ones of the plurality of word lines of the unselected sub-block that are erased.

According to an additional aspect of the disclosure, a method of operating a memory apparatus is provided. The memory apparatus includes memory cells each connected to one of a plurality of word lines. The memory cells are configured to retain a threshold voltage corresponding to one of a plurality of data states. The memory cells form a block including an unselected sub-block for an erase operation and a selected sub-block for the erase operation. The method includes the step of identifying ones of the plurality of word lines of the unselected sub-block that are programmed. The method also includes the step of applying a selected erase enable voltage to ones of the plurality of word lines of the selected sub-block while applying an unselected erase enable voltage to ones of the plurality of word lines of the unselected sub-block to erase the memory cells of the selected sub-block during the erase operation. The unselected erase enable voltage is different for ones of the plurality of word lines of the unselected sub-block that are programmed than for ones of the plurality of word lines of the unselected sub-block that are erased.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

For a detailed description of example embodiments, reference will now be made to the accompanying drawings in which.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
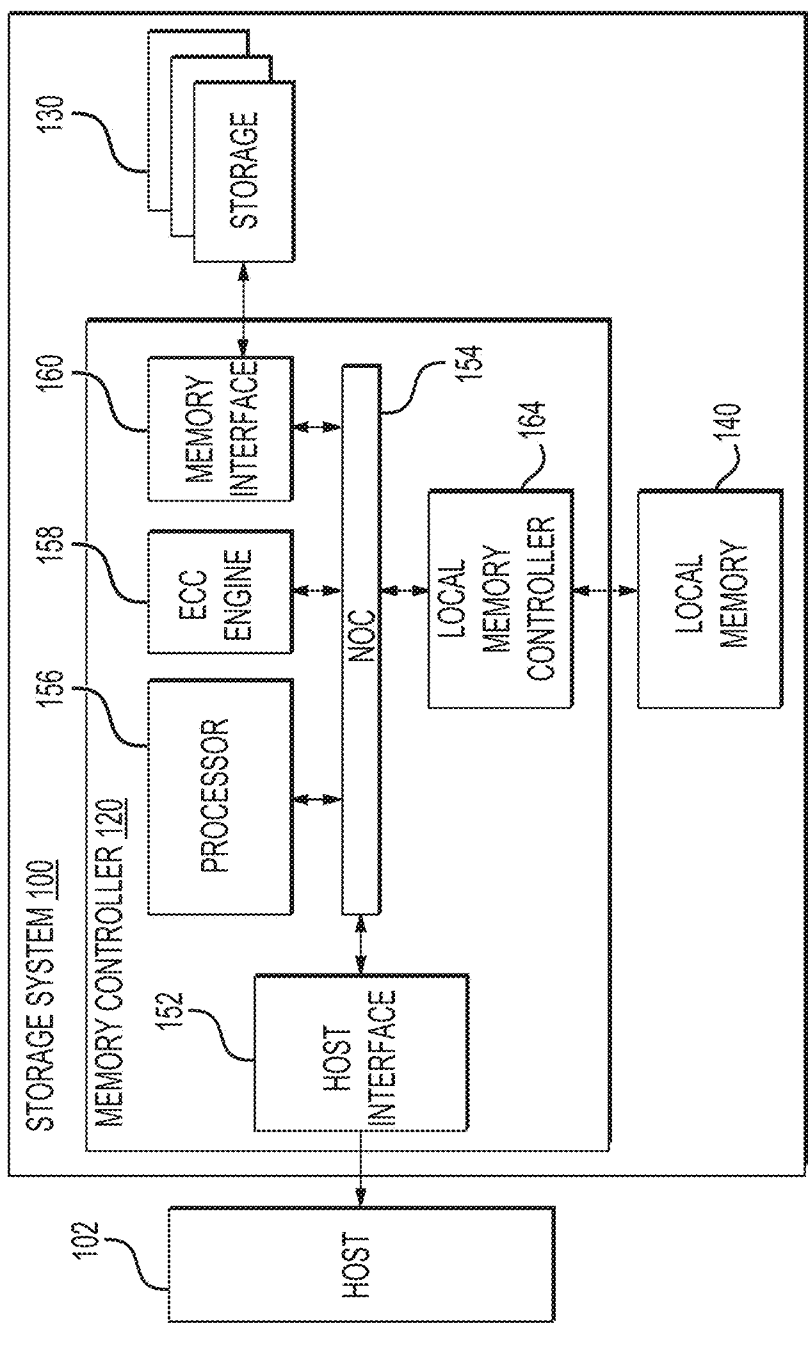
FIG. 1 is a block diagram depicting one embodiment of a storage system according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of forming of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in can be directly on the other layer of substrate, or intervening layers may also be present. Further, it will be understood that when a layer is referred to as being "under" another layer, it can be directly under, and one or more intervening layers may also be present. Furthermore, when a layer is referred to as "between" two layers, it can be the only layer between the two layers, or one or more intervening layers may also be present.

For purposes of this document, reference in the specification to "an embodiment," "one embodiment," "some embodiments," or "another embodiment" may be used to describe different embodiments or the same embodiment.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

As described, non-volatile memory systems are a type of memory that retains stored information without requiring an external power source. Non-volatile memory is widely used in various electronic devices and in stand-alone memory devices. For example, non-volatile memory can be found in laptops, digital audio player, digital cameras, smart phones, video games, scientific instruments, industrial robots, medical electronics, solid-state drives, USB drives, memory cards, and the like. Non-volatile memory can be electronically programmed/reprogrammed and erased.

Examples of non-volatile memory systems include flash memory, such as NAND flash or NOR flash. NAND flash memory structures typically arrange multiple memory cell transistors (e.g., floating-gate transistors or charge trap transistors) in series with and between two select gates (e.g., a drain-side select gate and a source-side select gate). The memory cell transistors in series and the select gates may be referred to as a NAND string. NAND flash memory may be scaled in order to reduce cost per bit.

A programming operation for a set of memory cells of a memory device typically involves applying a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased state or be programmed to a data state (a programmed data state) different from the erased state. For example, in a one-bit per cell memory device (single-level cell (SLC)), there are two data states including the erased state and one higher data state. In a two-bit per cell memory device (multi-level cell (MLC)), there are four data states including the erased state and three higher data states referred to as the A, B and C data states (see FIG. 5A). In a three-bit per cell memory device (triple-level cell (TLC)), there are eight data states including the erased state and seven higher data states referred to as the A, B, C, D, E, F and G data states (see FIG. 5B). In a four-bit per cell memory device (quad-level cell (QLC)), there are sixteen data states including the erased state and fifteen higher data states referred to as the Er, S1, S2, S3, S4, S5, S6, S7, S8, S9, S10, S11, S12, S13, S14, S15 data states (see FIG. 5C). Each memory cell may store a data state (e.g., a binary value) and is programmed to a threshold voltage state corresponding to the data state. Each state represents a different value and is assigned a voltage window including a range of possible threshold voltages.

A block of the memory cells can be divided into multiple-sub-blocks and each sub-block can be programmed and erased separately. In other words, in the sub-block mode, memory cells of each sub-block can each be in an erased state (open sub-block), all in a programmed state (closed sub-block), or partially erased and programmed. However, an erase operation for the memory cells of one sub-block may be adversely affected depending on the erased or programmed state of the memory cells of another of the sub-blocks.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e, the L2P tables mentioned above) that identify the current translation between logical addresses and physical addresses. An entry in the L2P table may include an identification of a logical address and corresponding physical address. Although logical address to physical address tables (or L2P tables) include the word "tables" they need not be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
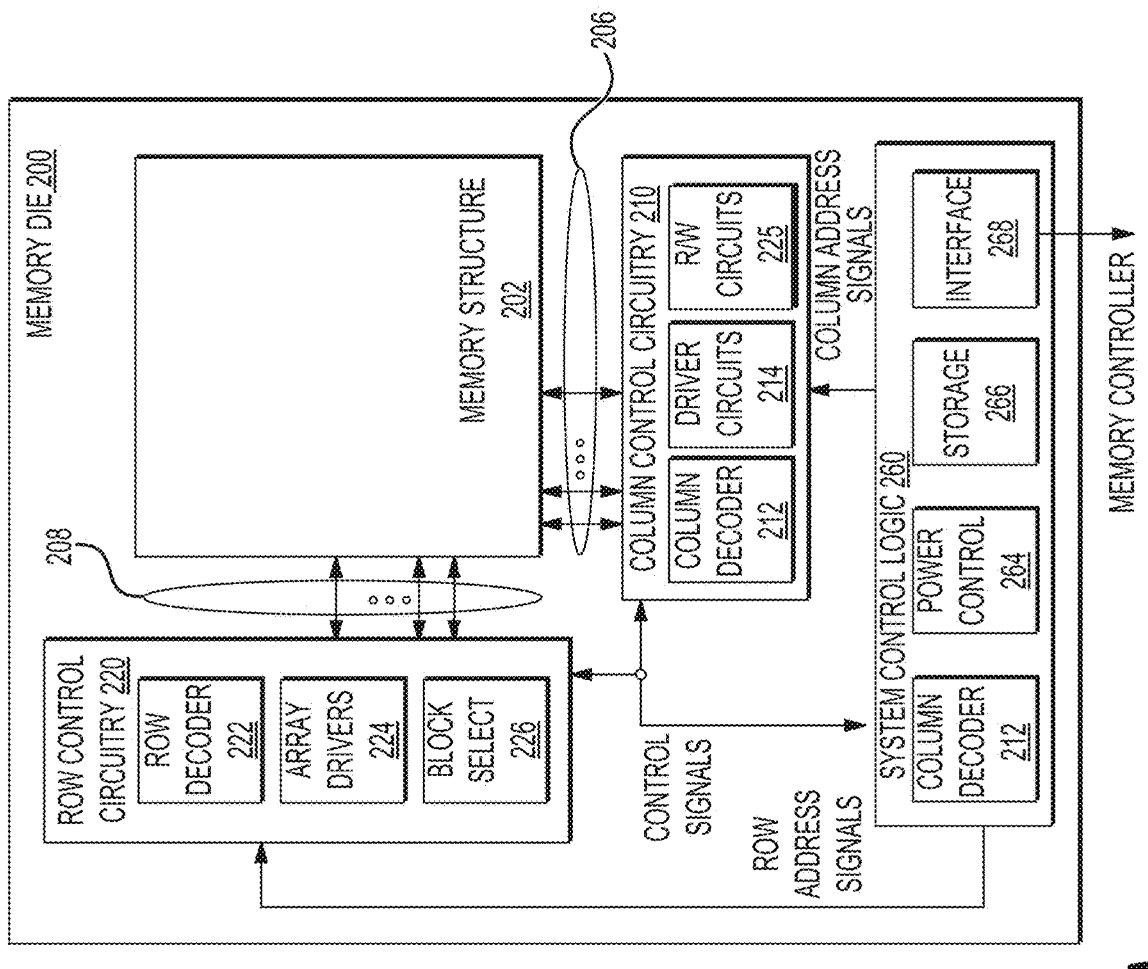
FIG. 2A is a block diagram of one embodiment of a memory die according to aspects of the disclosure.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of current, voltage, light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
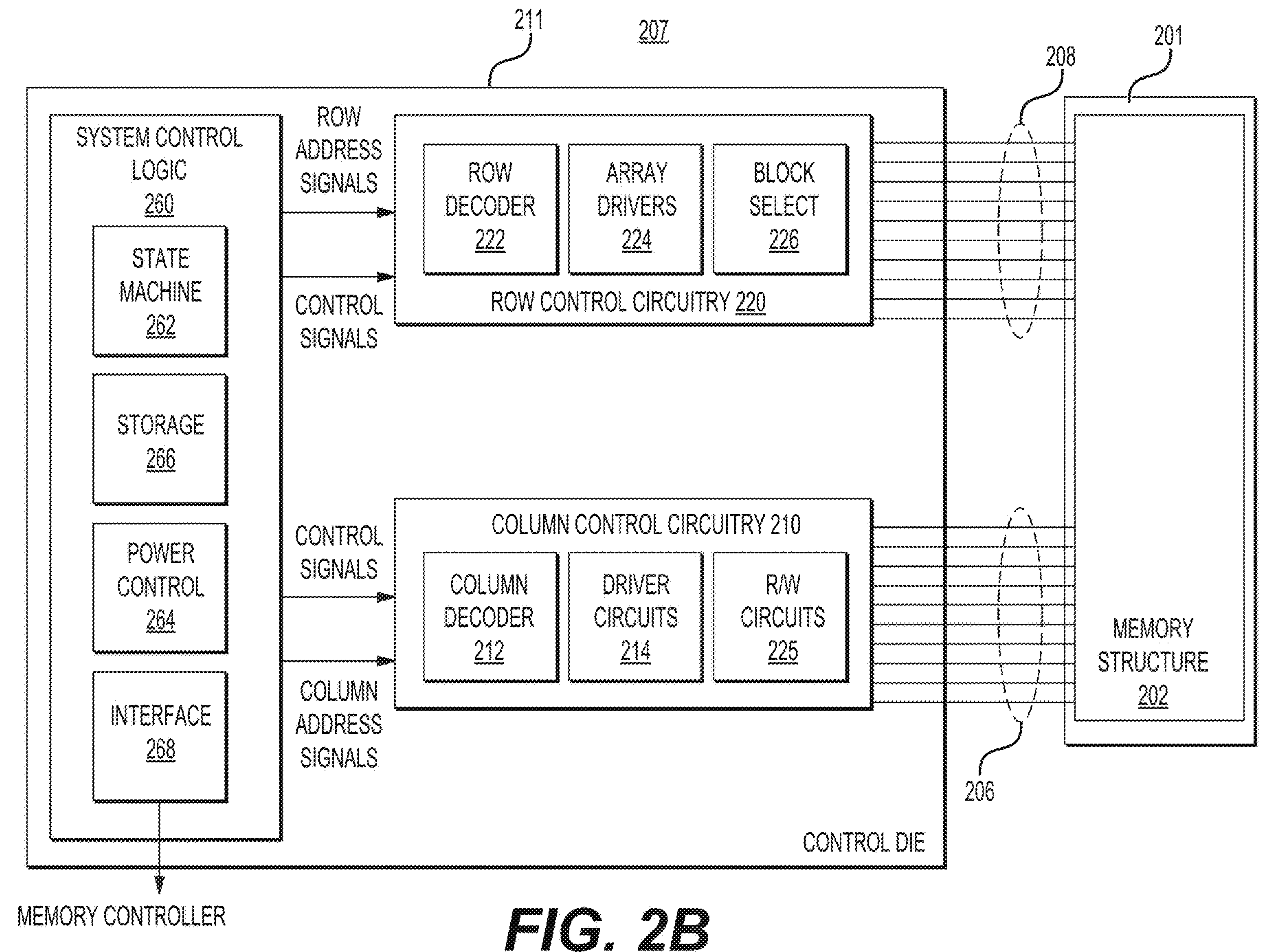
FIG. 2B is a block diagram of one embodiment of an integrated memory assembly according to aspects of the disclosure.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
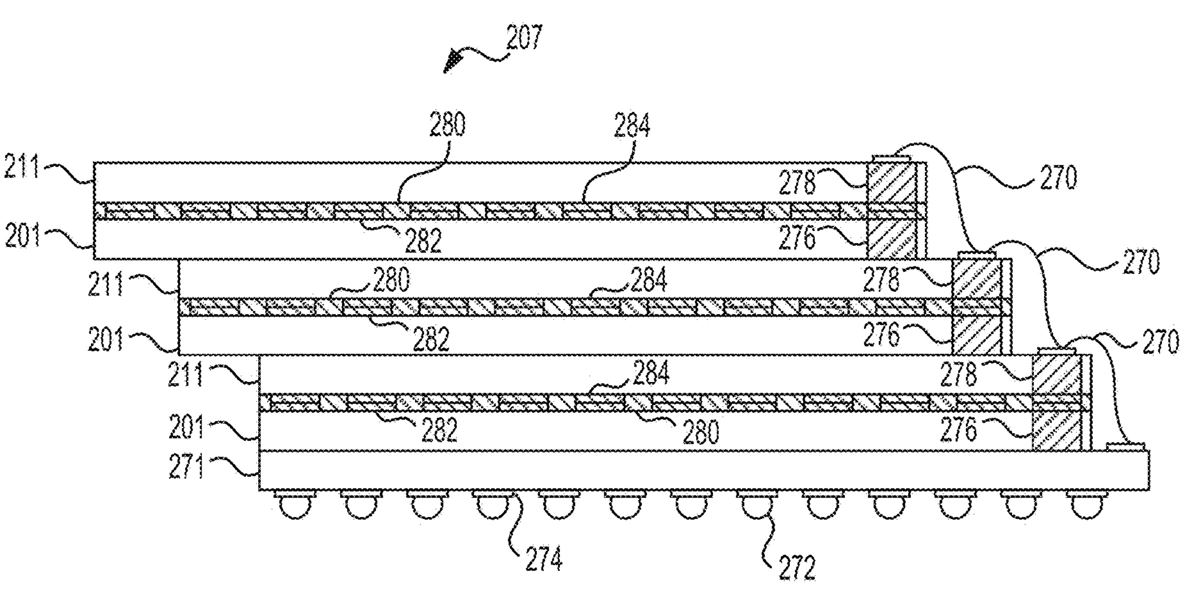
FIGS. 3A and 3B depict different embodiments of integrated memory assemblies according to aspects of the disclosure.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
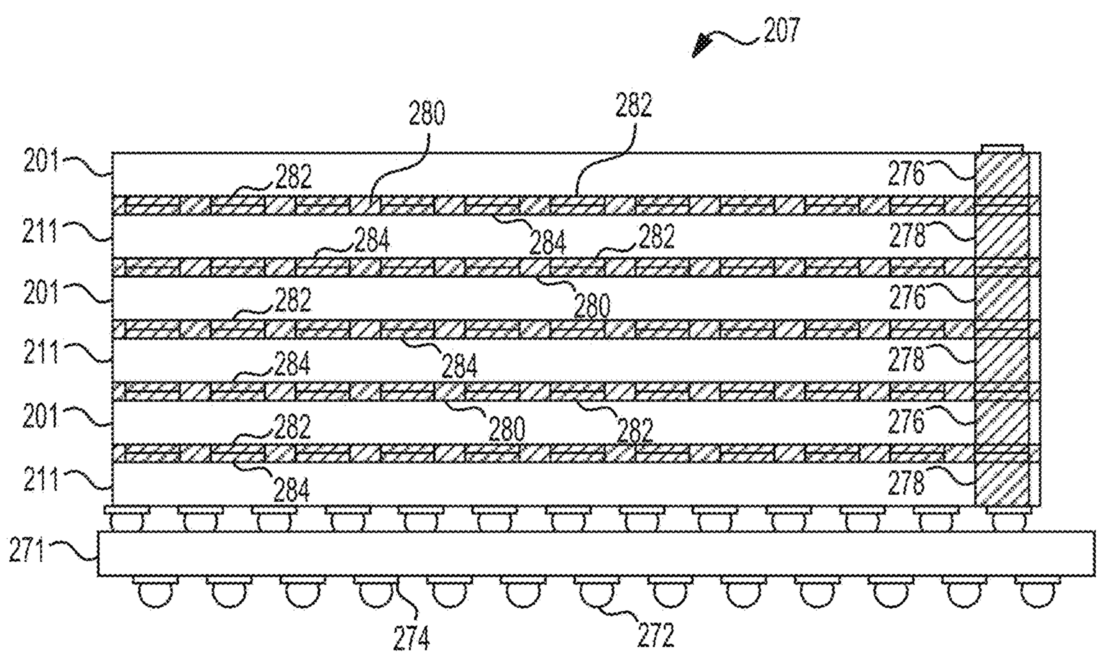

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 4:
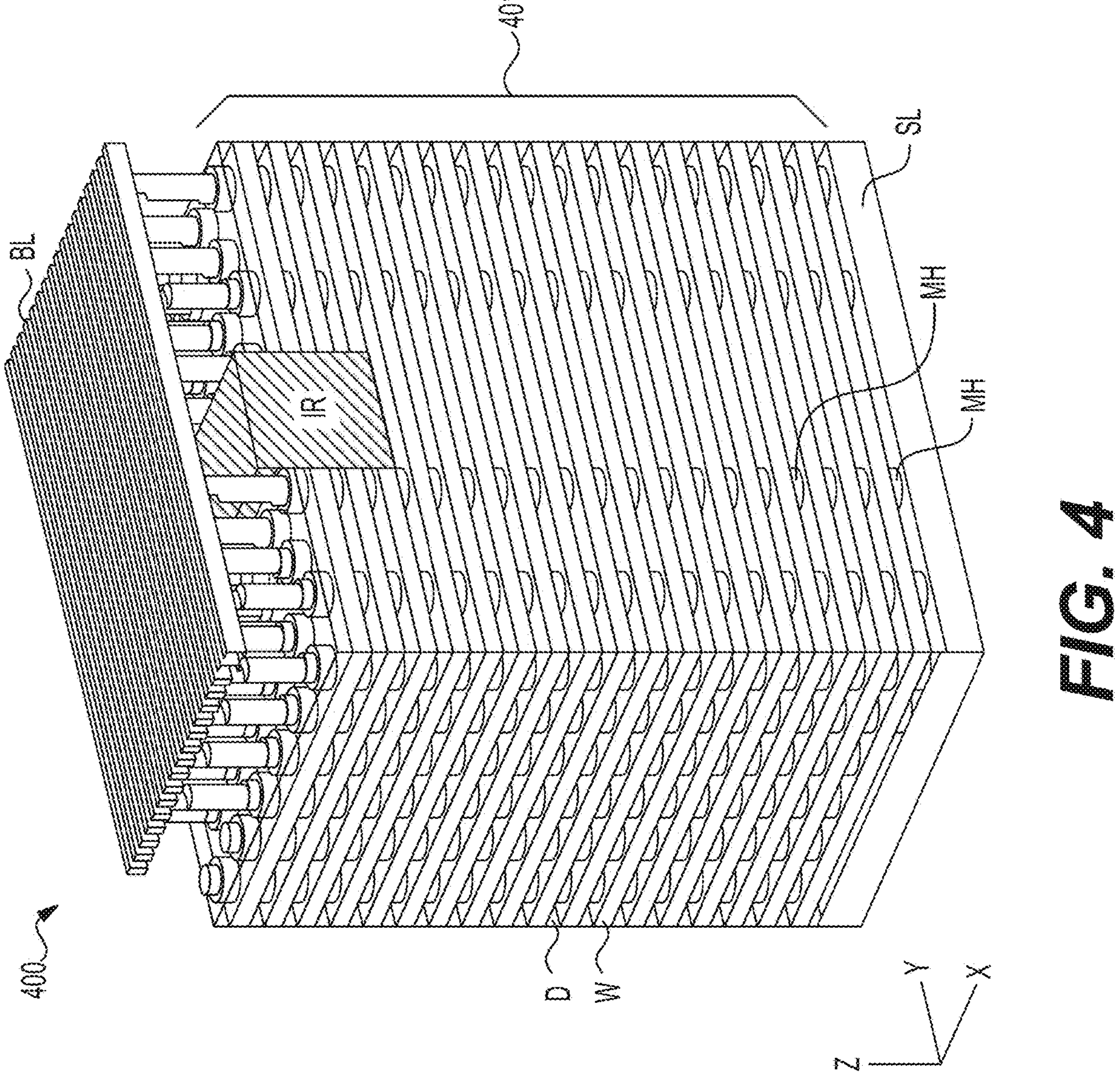
FIG. 4 is a perspective view of a portion of one example embodiment of a monolithic three dimensional memory structure according to aspects of the disclosure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
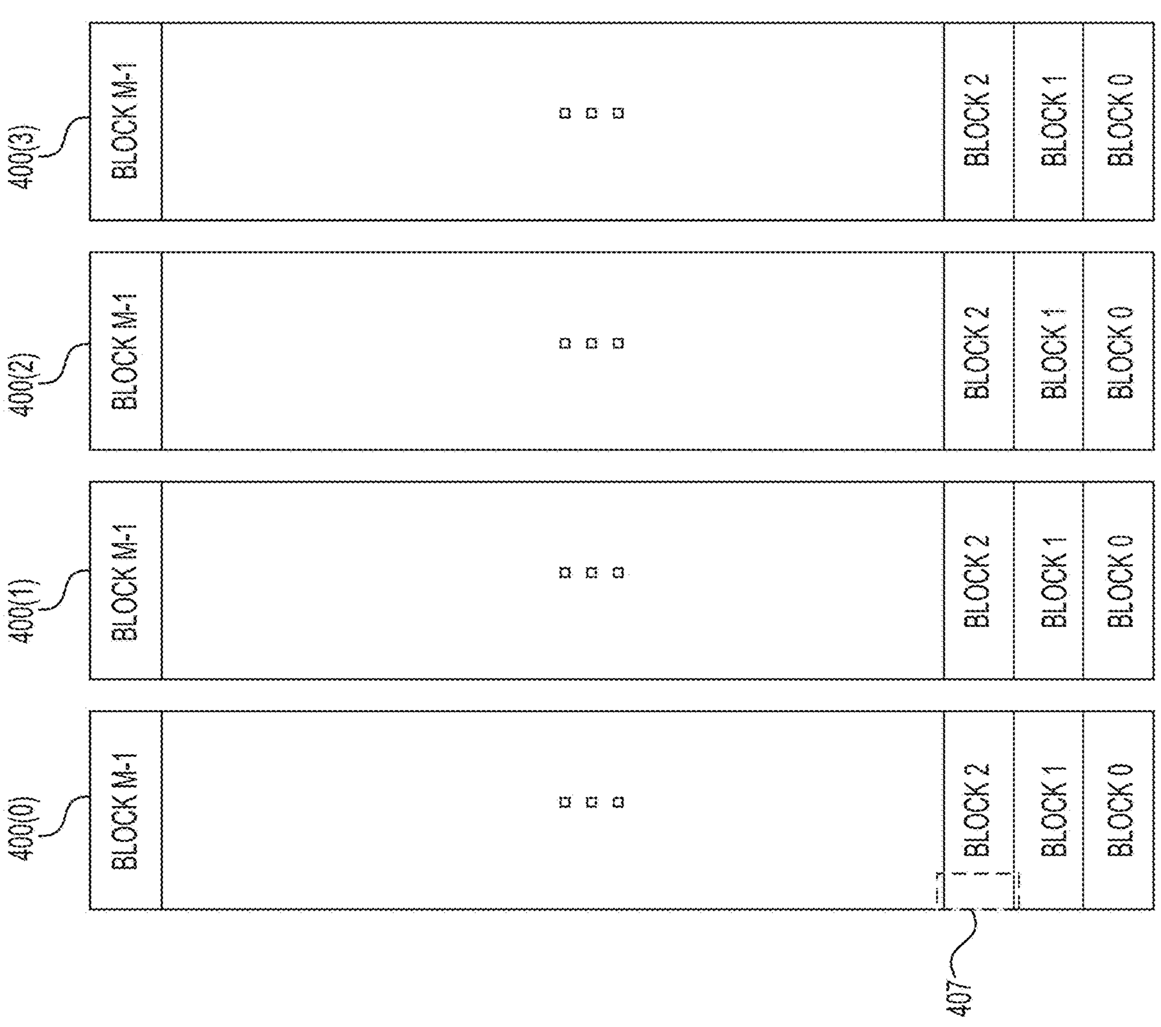
FIG. 4A is a block diagram of one embodiment of a memory structure having four planes according to aspects of the disclosure.
Figure 4B:
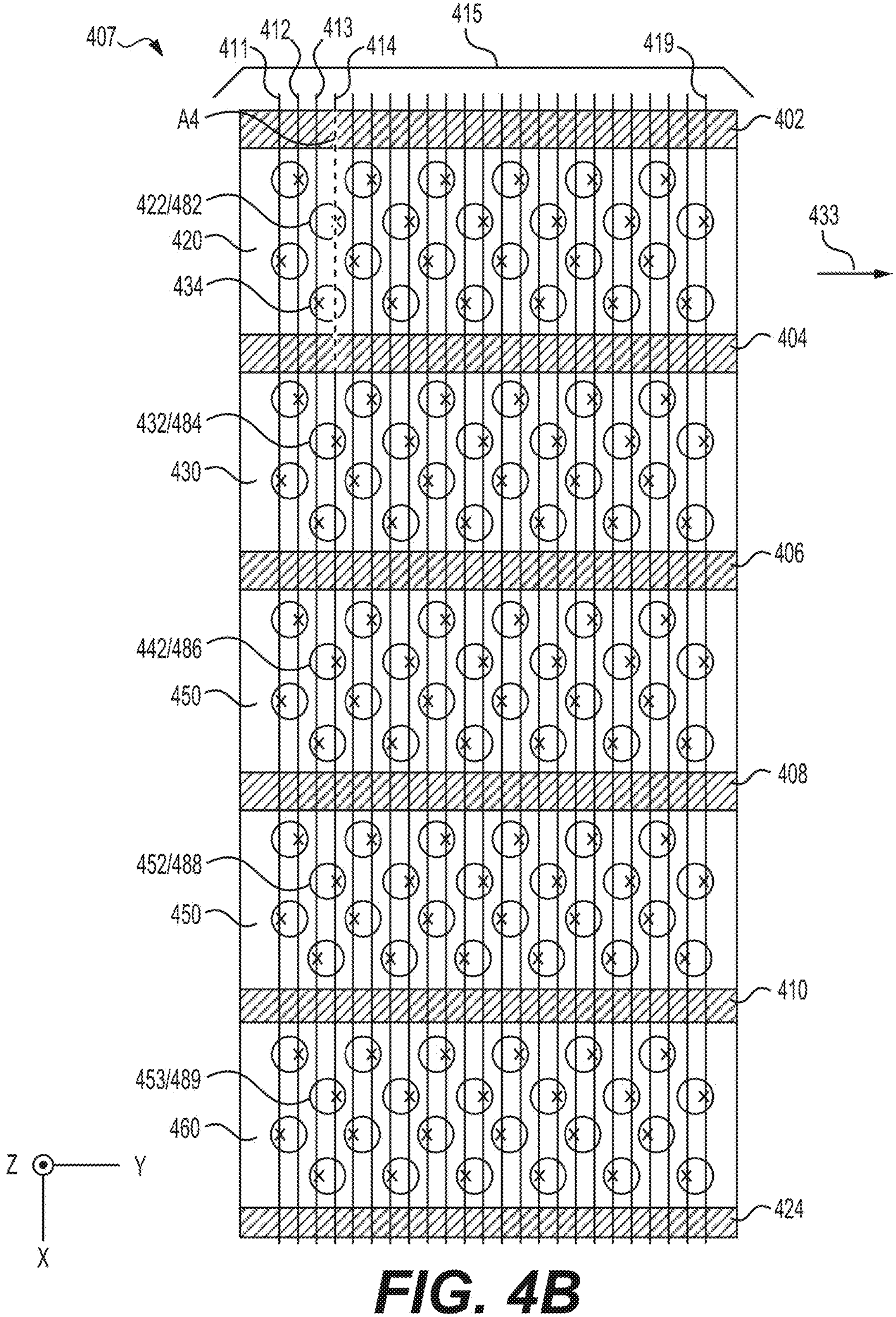
FIG. 4B is a block diagram depicting a top view of a portion of block of memory cells according to aspects of the disclosure.

FIG. 4A is a block diagram explaining one example organization of memory structure 202, which is divided into four planes 400(0), 400(1), 400(2), 400(3). Each plane is then divided into M blocks. In one example, each plane has about 2000 physical blocks. However, different numbers of physical blocks and planes can also be used. In one embodiment, a physical block of memory cells is a unit of erase. That is, all memory cells of a physical block are erased together. In other embodiments, physical blocks can be divided into sub-blocks and the sub-blocks can be the unit of erase. Memory cells can also be grouped into physical blocks for other reasons, such as to organize the memory structure to enable the signaling and selection circuits. In some embodiments, a physical block represents a groups of connected memory cells as the memory cells of a physical block share a common set of word lines. For example, the word lines for a physical block are all connected to all of the vertical NAND strings for that physical block. Although FIG. 4A shows four planes 400(0)-400(3), more or fewer than four planes can be implemented. In some embodiments, memory structure 202 includes eight planes. In some embodiments, erase can be performed in parallel in the four planes 400(0)-400(3). For example, one block in each plane may be selected for erase in a parallel multi-block erase. Because the blocks being erased are on different planes, this could also be referred to as a multi-plane erase. FIGS. 4B-4E depict an example three dimensional ("3D") NAND structure that corresponds to the structure of FIG. 4 and can be used to implement memory structure 202 of FIGS. 2A and 2B. FIG. 4B is a block diagram depicting a top view of a portion 407 of Block 2 in plane 400(0). As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452, and 453. Vertical column 422 implements NAND string 482. Vertical column 432 implements NAND string 484. Vertical column 442 implements NAND string 486. Vertical column 452 implements NAND string 488. Vertical column 453 implements NAND string 489. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442, 452, and 453.

The block depicted in FIG. 4B includes a set of isolation regions 402, 404, 406, 408, 410, and 424, which are formed of $SiO_2$; however, other dielectric materials can also be used. Isolation regions 402, 404, 406, 408, 410, and 424 serve to divide the top layers of the block into five regions; for example, the top layer depicted in FIG. 4B is divided into regions 420, 430, 440, 450, and 460 of which are referred to as sub-blocks. In one embodiment, isolation regions 402 and 424 separate the block from adjacent blocks. Thus, isolation regions 402 and 424 may extend down to the substrate. In one embodiment, the isolation regions 404, 406, 408, and 410 only divide the layers used to implement select gates so that NAND strings in different sub-blocks can be independently selected. Referring back to FIG. 4, the IR region may correspond to any of isolation regions 404, 406, 408 or 410. In one example implementation, a bit line only connects to one vertical column/NAND string in each of regions (sub-blocks) 420, 430, 440, 450 and 460. In that implementation, each block has twenty rows of active columns and each bit line connects to five vertical columns/NAND strings in each block. In one embodiment, all of the five vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region having four rows of vertical columns, five regions and twenty rows of vertical columns in a block, those exact numbers are an example implementation. Other embodiments may include more or fewer regions per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
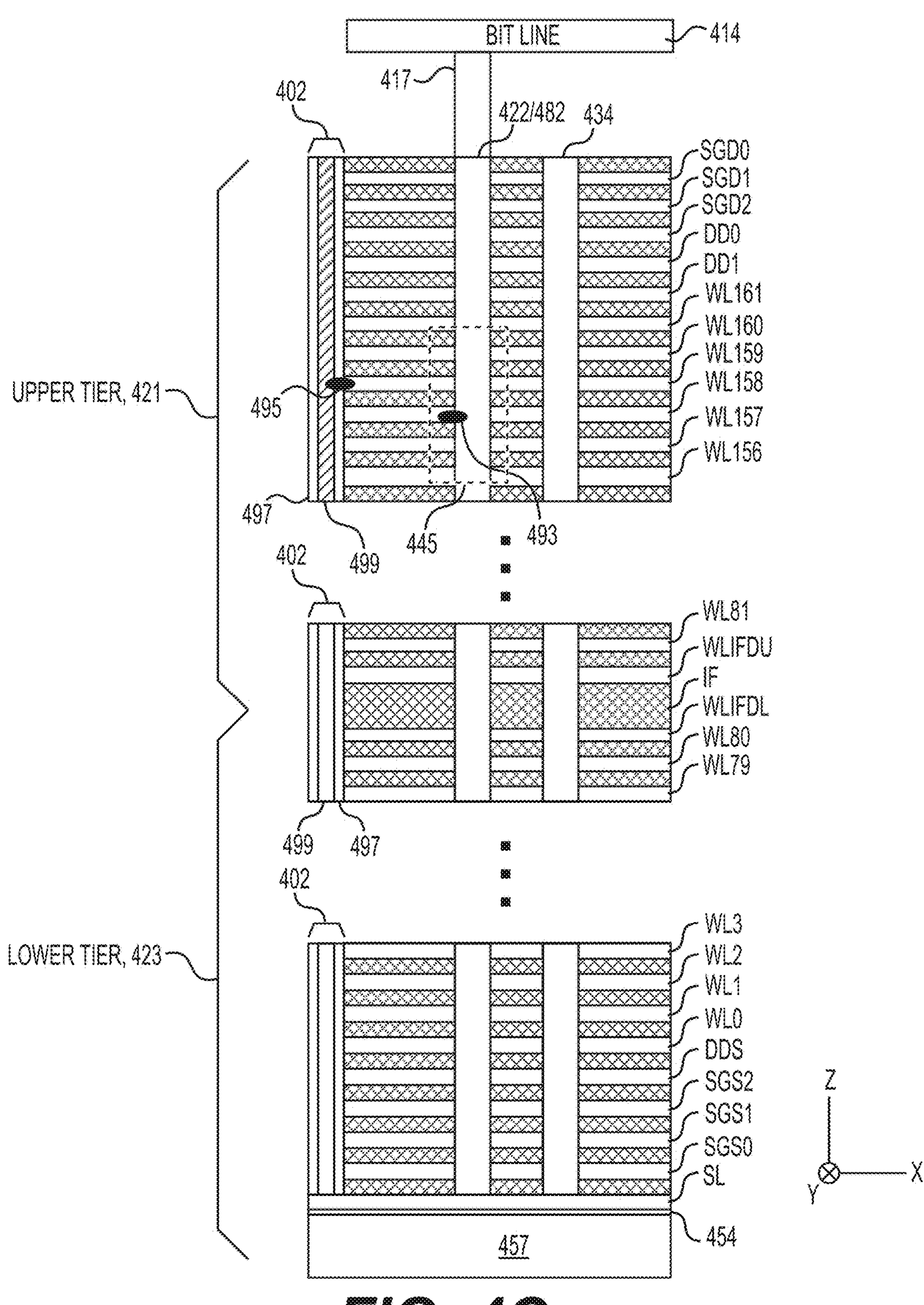
FIG. 4C depicts an embodiment of a stack showing a cross-sectional view along line AA of FIG. 4B according to aspects of the disclosure.

FIG. 4C depicts a portion of one embodiment of a three dimensional memory structure 202 showing a cross-sectional view along line AA of FIG. 4B. This cross sectional view cuts through vertical columns (NAND strings) 422 and 434 of region 420 (see FIG. 4B). The structure of FIG. 4C includes three drain side select gate layers (SGD0, SGD1 and SGD2). The structure of FIG. 4C also includes three source side select gate layers (SGS0, SGS1 and SGS2). The structure of FIG. 4C also includes five dummy word line layers DD0, DD1, WLIFDU, WLIDDL, DDS; one hundred sixty two word line layers WL0-WL161 for connecting to data memory cells. Dielectric layers are depicted between the conductive layers just described. Other embodiments can implement more or fewer than the numbers described above for FIG. 4C. In one embodiment, SGD0, SGD1 and SGD2 are electrically connected together; and SGS0, SGS1 and SGS2 are electrically connected together.

FIG. 4C depicts an embodiment of a stack having two tiers. The two-tier stack comprises an upper tier 421 and a lower tier 423. A two-tier other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole were etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the upper tier 421 and the lower tier 423 are erased independent of one another. Hence, data may be maintained in the lower tier 423 after the upper tier 421 is erased. Likewise, data may be maintained in the upper tier 421 after the lower tier 423 is erased.

Vertical columns 432 and 434 are depicted protruding through the drain side select layers, source side select layers, IF layer, dummy word line layers and word line layers. In one embodiment, each vertical column comprises a vertical NAND string. Below the vertical columns and the layers listed below is substrate 457, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to bit line 414 via connector 417.

One of the isolation regions 402 is depicted adjacent to the stack, in agreement with FIG. 4B. The isolation region 402 has a conductive region 499 surrounded by an insulating material 497. The conductive region 499 extends down to the source line (SL) and provides operating voltages to the SL. In one embodiment, an erase voltage is provided by way of conductive region 499 to the SL. The conductive region 499 may be formed from, for example, tungsten. The conductive region 499 may be referred to herein as a local interconnect (LI). The insulating material 497 may be formed from, for example, silicon oxide. It is possible for a short circuit to occur between a word line and the conductive region 499. An example defect 495 that results in a short circuit between WL159 and the conductive region 499 is depicted. Defects such as defect 495 may be present when the memory structure is manufactured or may develop as a result of normal memory operations.

Another type of short circuit that may be present is a word line to memory hole short circuit. Defect 493 may result in a short circuit between WL158 and the memory hole 422. Defects such as defect 493 may be present when the memory structure is manufactured or may develop as a result of normal memory operations. Short circuits such as, but not limited to those that result from defects 493, 495 may result in leakage current during memory operations such as read, program and erase. As will be discussed in further detail below, leakage currents during erase could result in a severe reduction in the magnitude of the erase voltage, which can impair erase operations. Such leakage current may be especially problematic when erasing multiple erase blocks in parallel. While leakage currents are one example of a problem that can lead to an erase to fail other problems can also lead to erase failure.

For ease of reference, drain side select layers, source side select layers, dummy word line layers, and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W161 connect to memory cells (also called data memory cells). Dummy word line layers DD0, DD1 and DDS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect (or cut off) the channels of respective NAND strings from bit lines. Source side select layers SGS0, SGS1, and SGS2 are used to electrically connect and disconnect (or cut off) the channels of respective NAND strings from the source line SL.

Figure 4D:
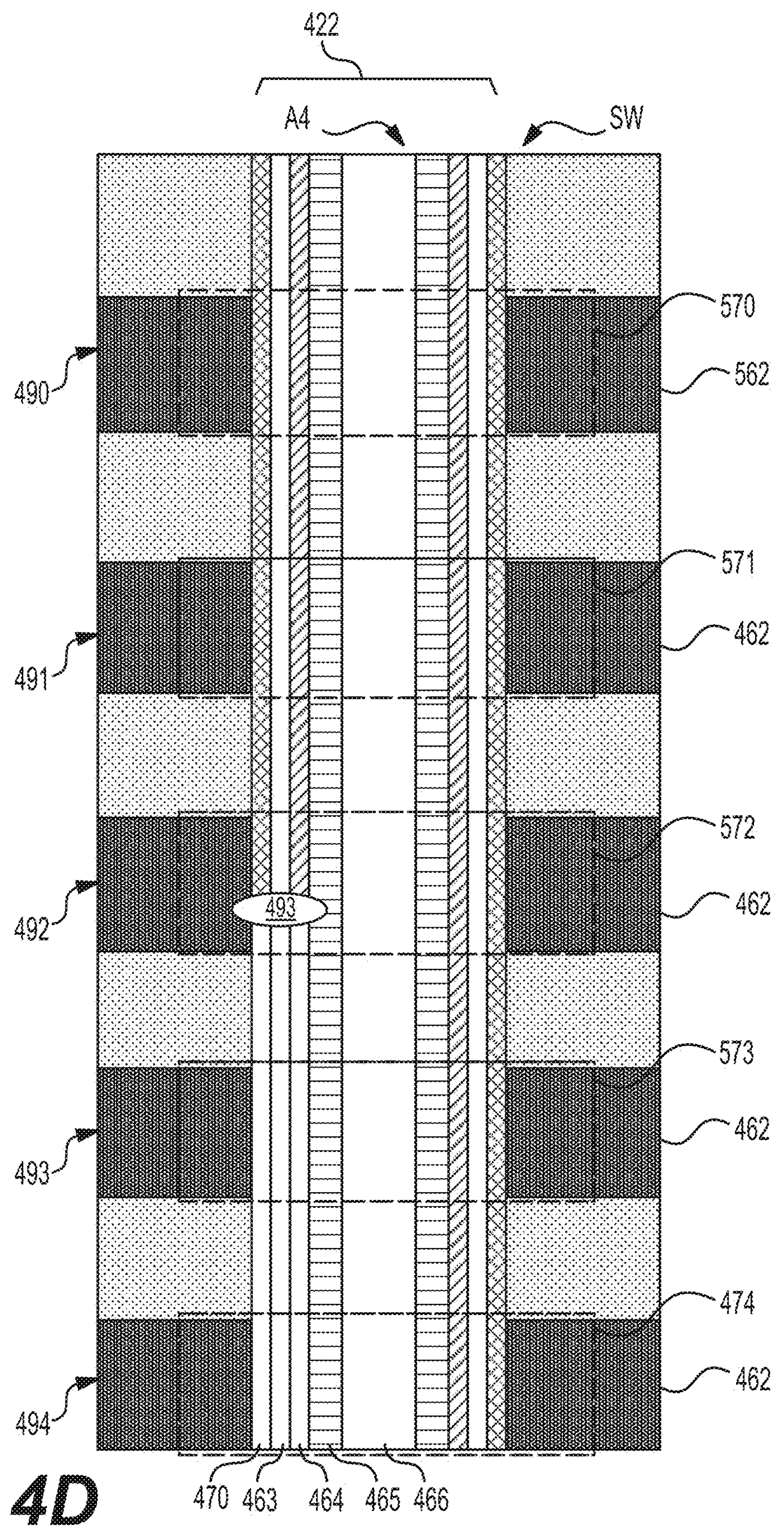
FIG. 4D depicts a view of the region 445 of FIG. 4C according to aspects of the disclosure.

FIG. 4D depicts a view of the region 445 of FIG. 4C. Included are WL156-160 and dielectric layers DL164-DL168. Data memory cell transistors 570, 571, 572, 573, and 574 are indicated by the dashed lines. A number of layers can be deposited along the sidewall (SW) of the memory hole 422 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

As mentioned above, one type of short circuit that may be detected is a word line to memory hole short circuit. Defect 493 may result in a short circuit between WL158 and one or more of the layers in the memory hole 422 such as, for example, charge-trapping layer 463 and/or polysilicon body 465. In one embodiment, such word line to memory hole short circuits are detected early during an erase procedure of multiple erase blocks.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
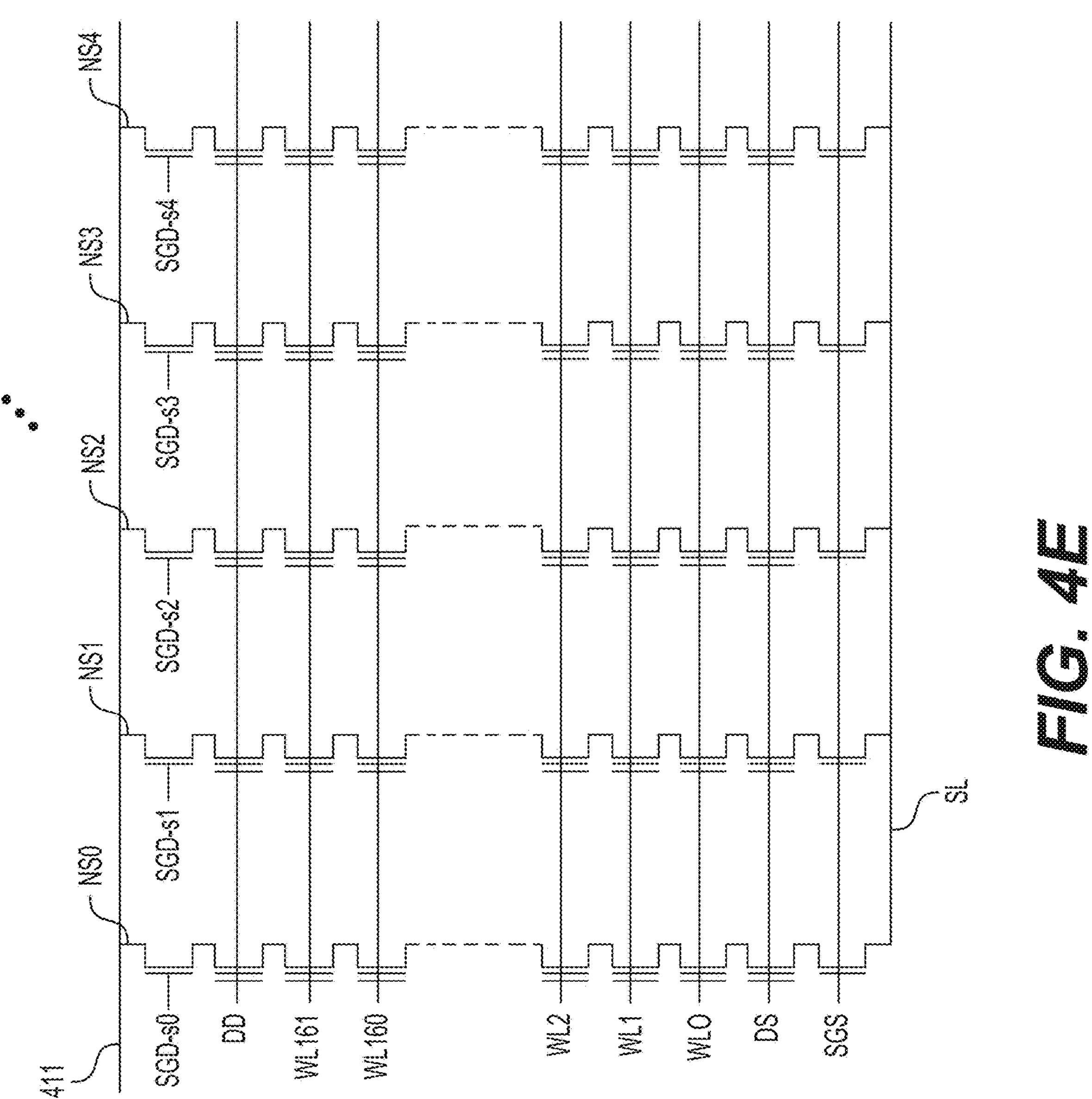
FIG. 4E is a schematic diagram of a portion of one embodiment of a block, depicting several NAND strings according to aspects of the disclosure.

FIG. 4E is a schematic diagram of a portion of the memory depicted in in FIGS. 4-4D. FIG. 4E shows physical word lines WL0-WL161 running across the entire block. The structure of FIG. 4E corresponds to portion 407 in Block 2 of FIGS. 4A-4B (only bit line 411 is depicted in FIG. 4E). Within the block, each bit line is connected to five NAND strings. Drain side selection lines SGD-s0, SGD-s1, SGD-s2, SGD-s3 and SGD-s4 are used to determine which of the five NAND strings (NS0, NS1, NS2, NS3, NS4) connect to the associated bit line. Other NAND strings of the block and other bit lines are not depicted in FIG. 4E. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. There may be more or fewer than five sub-blocks in a block.

A source side selection line SGS connects/disconnects the NAND strings to/from the common source line. In some embodiments, there is a source side selection line for each sub-block (similar to the five SGD-s0, SGD-s1, SGD-s2, SGD-s3 and SGD-s4). The block can also be thought of as divided into five sub-blocks SB0, SB1, SB2, SB3, SB4. Sub-block SB0 corresponds to those vertical NAND strings controlled by SGD-s0, Sub-block SB1 corresponds to those vertical NAND strings controlled by SGD-s1, Sub-block SB2 corresponds to those vertical NAND strings controlled by SGD-s2, Sub-block SB3 corresponds to those vertical NAND strings controlled by SGD-s3, and Sub-block SB4 corresponds to those vertical NAND strings controlled by SGD-s4.

Although the example memories of FIGS. 4-4E are three dimensional memory structure that includes vertical NAND strings with charge-trapping material, other (2D and 3D) memory structures can also be used with the technology described herein.

The memory systems discussed above can be erased, programmed and read. Each memory cell may be associated with a memory state according to write data in a program command. Based on its memory state, a memory cell will either remain in the erased state or be programmed to a memory state (a programmed memory state) different from the erased state.

For example, in a two-bit per cell memory device (sometimes referred to as a multi-level cell (MLC)), there are four memory states including the erased state and three programmed memory states referred to as the A, B and C memory states. In a three-bit per cell memory device (sometimes referred to as a tri-level cell (TLC)), there are eight memory states including the erased state and seven programmed memory states referred to as the A, B, C, D, E, F and G memory states. In a four-bit per cell memory device (sometimes referred to as a quad-level cell (QLC)), there are sixteen memory states including the erased state and fifteen programmed memory states referred to as the Er, S1, S2, S3, S4, S5, S6, S7, S8, S9, S10, S11, S12, S13, S14 and S15 memory states.

Figures 5A, 5B, 5C:
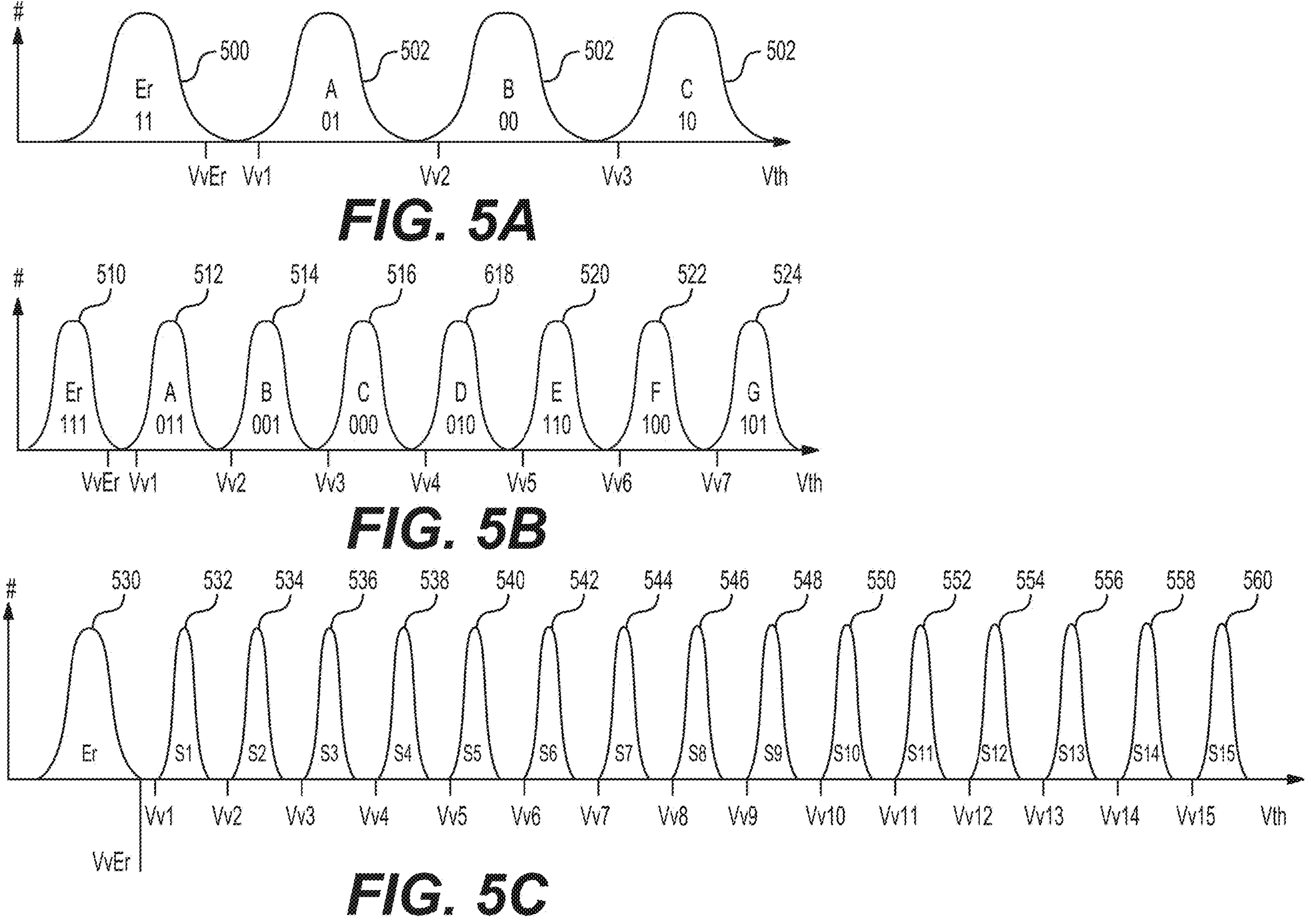
FIGS. 5A, 5B and 5C depict threshold voltage distributions according to aspects of the disclosure.

FIG. 5A depicts an embodiment of threshold voltage Vth distributions for a four-state memory device in which each memory cell stores two bits of data. A first threshold voltage Vth distribution 500 is provided for erased (Er-state) storage elements. Three threshold voltage Vth distributions 502, 504 and 506 represent programmed memory states A, B and C, respectively. A 2-bit code having lower and upper bits can be used to represent each of the four memory states. In an embodiment, the "Er," "A," "B," and "C" memory states are respectively represented by "11," "01," "00," and "10."

FIG. 5B depicts an embodiment of threshold voltage Vth distributions for an eight-state memory device in which each memory cell stores three bits of data. A first threshold voltage Vth distribution 510 is provided for Er-state storage elements. Seven threshold voltage Vth distributions 512, 514, 516, 518, 520, 522 and 524 represent programmed memory states A, B, C, D, E, F and G, respectively. A 3-bit code having lower page, middle page and upper page bits can be used to represent each of the eight memory states. In an embodiment, the "Er," "A," "B," "C," "D," "E," "F" and "G" memory states are respectively represented by "111," "011," "001," "000," "010," "110," "100" and "101."

FIG. 5C depicts an embodiment of threshold voltage Vth distributions for a sixteen-state memory device in which each memory cell stores four bits of data. A first threshold voltage Vth distribution 530 is provided for erased Er-state storage elements. Fifteen threshold voltage Vth distributions 532, 534, 536, 538, 540, 542, 544, 546, 548, 550, 552, 554, 556, 558 and 5 60 represent programmed memory states S1, S2, S3, S4, S5, S6, S7, S8, S9, S10, S11, S12, S13, S14 and S15, respectively.

A 4-bit code having lower page, middle page, upper page and top page bits can be used to represent each of the sixteen memory states. In an embodiment, the S0, S1, S2, S3, S4, S5, S6, S7, S8, S9, S10, S11, S12, S13, S14 and S15 memory states are respectively represented by "1111," "1110," "1100," "1101," "1001," "0001," "0101," "0100," "0110," "0010," "0000," "1000," "1010," "1011," "0011," and "0111," respectively.

The technology described herein also can be used with other types of programming in addition to full sequence programming (including, but not limited to, multiple stage/phase programming). In some embodiments, programmed states (e.g., S1-S15) can overlap, with controller 120 (FIG. 1) relying on error correction to identify the correct data being stored.

In one embodiment memory cells are erased prior to programming, and erasing is the process of changing the threshold voltage of one or more memory cells from a programmed data state to an erased data state. For example, changing the threshold voltage of one or more memory cells from states A-C to state E of FIG. 5A, from states A-G to state Er of FIG. 5B, or from states S1-S15 to state Er of FIG. 5C.

Figure 6:
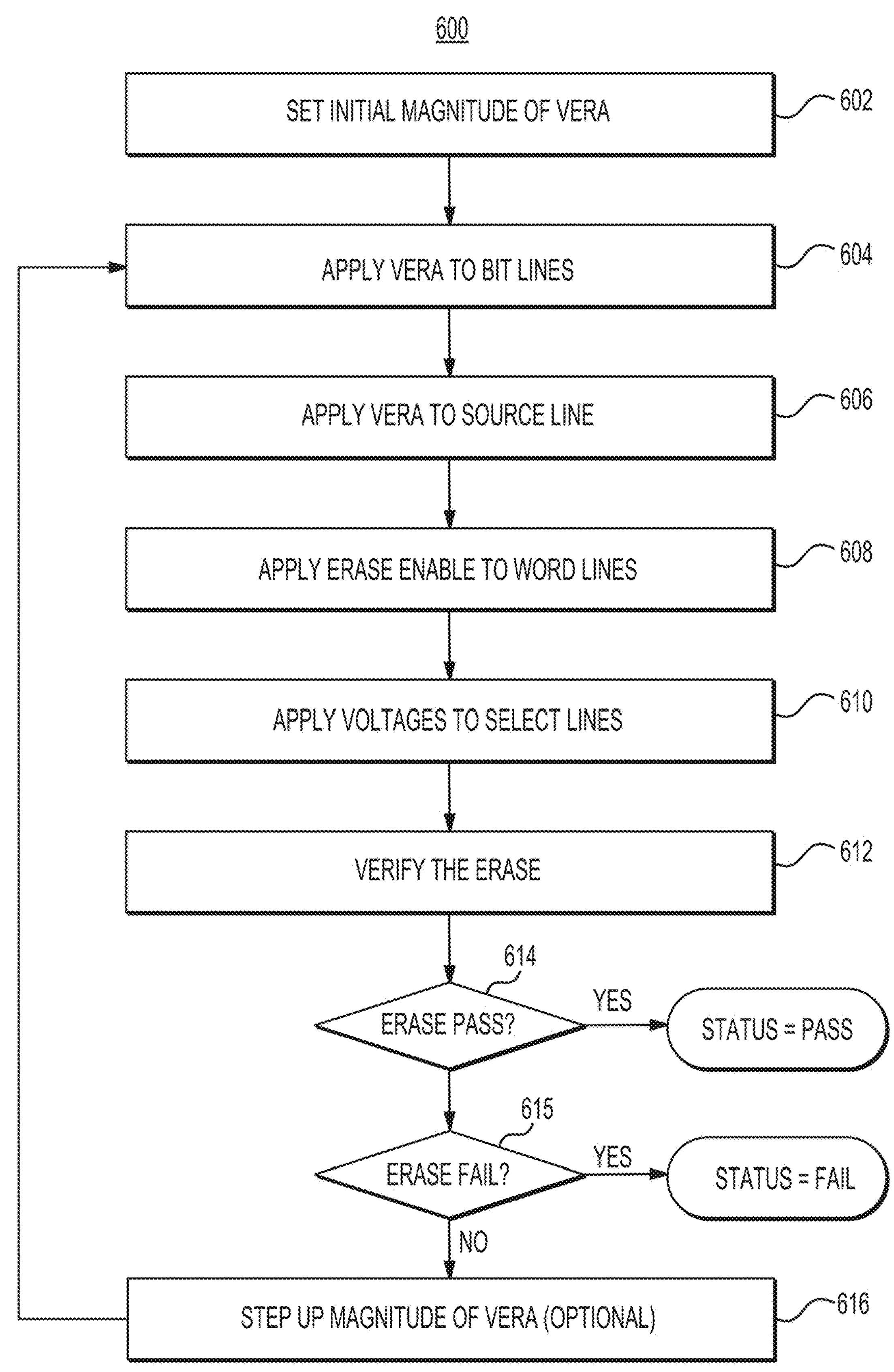
FIG. 6 is a flowchart describing one embodiment of a process for erasing memory cells according to aspects of the disclosure.

FIG. 6 is a flowchart describing one embodiment of a process 600 for erasing memory cells. The process 600 may be used to erase an erase block of NAND memory cells. In one embodiment, the process 600 may be used to erase an entire physical block of NAND memory cells. In one embodiment, the process 600 may be used to erase a sub-block of the physical block of NAND memory cells. One type of sub-block are the sub-blocks selected by different select lines such as in FIG. 4E. For example, the sub-block selected by SGD-s0 may be erased independent of the other four sub-blocks. Thus, in the example in FIG. 4E, there may be five sub-blocks selected by the respective SGDs. Another type of sub-block may be referred to as tiers, as depicted in FIG. 4C. In the example in FIG. 4C, upper tier 421 is in one erase block and lower tier 423 is in another erase block. The sub-block concepts in FIGS. 4C and 4E can be combined to form erase blocks. In an embodiment, system control logic 260 performs process 600 in response to a command from the memory controller 120. Process 600 describes a double sided erase in which an erase voltage (Vera) is applied at both ends of NAND strings (e.g., bit lines and source line). A variant is to perform a single sided erase in which the erase voltage is applied to only one end of the NAND strings. The process 600 may be performed in parallel on different erase blocks, which may be in different planes on the same memory die.

Step 602 includes setting an initial magnitude of an erase voltage (Vera). The initial Vera may have a relatively large magnitude such as, for example, 20V. Step 604 includes applying Vera to bit lines associated with the erase block. Step 606 includes applying Vera to one or more source lines associated with the erase block. Step 608 includes applying an erase enable to the word lines in the erase block. In one embodiment, the erase enable voltage is 0V. Step 610 includes applying a select voltage to select lines (e.g., SGD, SGS). The select voltage allows Vera to pass to the NAND channels.

Thus, the erase of a memory cell includes applying an erase enable voltage (e.g., 0V) to the control gate of the memory cell while applying an erase voltage (e.g., about 20V) to a channel or body of the memory cell. An erase voltage is defined herein as a voltage applied to a channel or body of a memory cell that will erase the memory cell providing that the erase enable voltage is also applied to a control gate of that memory cell. A memory cell that has the erase voltage applied to its channel (body) may be inhibited from erase by applying an erase inhibit voltage (e.g., the erase voltage or about 20V, but the erase inhibit voltage could have a lower magnitude) to its control gate. An erase inhibit voltage is defined herein as a voltage that will inhibit erase of a memory cell despite the erase voltage being applied to a channel of that memory cell.

One technique to erase memory cells is to bias a p-well substrate to a high voltage to charge up a NAND channel. An erase enable voltage is applied to control gates of memory cells while the NAND channel is at a high voltage to erase the memory cells. In one embodiment, a p-well erase is performed. In some cases, the NAND strings within a block may share a common well (e.g., a p-well). In a p-well erase, holes may be provided from the p-well in the substrate below the NAND strings. In one embodiment, memory cells may be erased by raising the p-well to an erase voltage (e.g., 20 volts) for a sufficient period of time and grounding the word lines connected to memory cells to be erased. These erase bias conditions may cause electrons to be transferred from the charge-trapping layer or film 463 through the tunneling oxide 464, thereby lowering the threshold voltage of the memory cells within the selected block.

Another approach to erasing memory cells is to generate gate induced drain leakage (GIDL) current to charge up the NAND string channel. An erase enable voltage is applied to control gates of the memory cells, while maintaining the string channel potential to erase the memory cells. The GIDL current is generated by causing a drain-to-gate voltage at a select transistor (drain side and/or source side), in one embodiment. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel 465, thereby raising the potential of the channel 465. The other type of carriers, e.g., electrons, are extracted from the channel 465, in the direction of a bit line or in the direction of a source line, by an electric field. During erase, the holes may tunnel from the channel to a charge storage region 463 of memory cells and recombine with electrons there, to lower the threshold voltage of the memory cells.

After steps 604-610 are performed, an erase verify may be performed in step 612. The erase verify may apply for example VvEr (See FIGS. 5A-5C) to each data WL in the erase block. If all memory cells in the erase block on a given NAND string have a Vt below VvEr then the NAND string will conduct a significant current. Note that if only one tier is being erased then a pass voltage may be applied to word lines in the tier that is not being erased. The pass voltage is a voltage having sufficient magnitude to be above the respective Vts of the memory cells in the tier not being erased. In some embodiments, if a NAND string passes erase of the NAND string may end at this point. Step 614 is a determination of whether erase is complete. If erase has passed then the process 600 completes with a status of pass. If erase has not yet passed then a determination may be made in step 615 of whether erase has failed. In one embodiment, the erase process is allowed a certain number of loops to complete and if erase does not pass within the allowed number, then the status is "fail." However, another test can be performed to determine an erase fail such as whether a certain data state (e.g., the A-state) has completed programming within an allowed number for that data state. If the erase has not failed, then the magnitude of the erase voltage may optionally be increased in step 616. Thus, steps 604-615 are repeated.

Process 600 describes a double-sided erase in which Vera is applied to both ends of the NAND strings (bit lines and source line(s)). One embodiment is a single-side erase in which Vera is applied to the bit lines but not to the source line(s). One embodiment is a single-side erase in which Vera is applied to the source line(s) but not to the bit lines.

Figure 7:
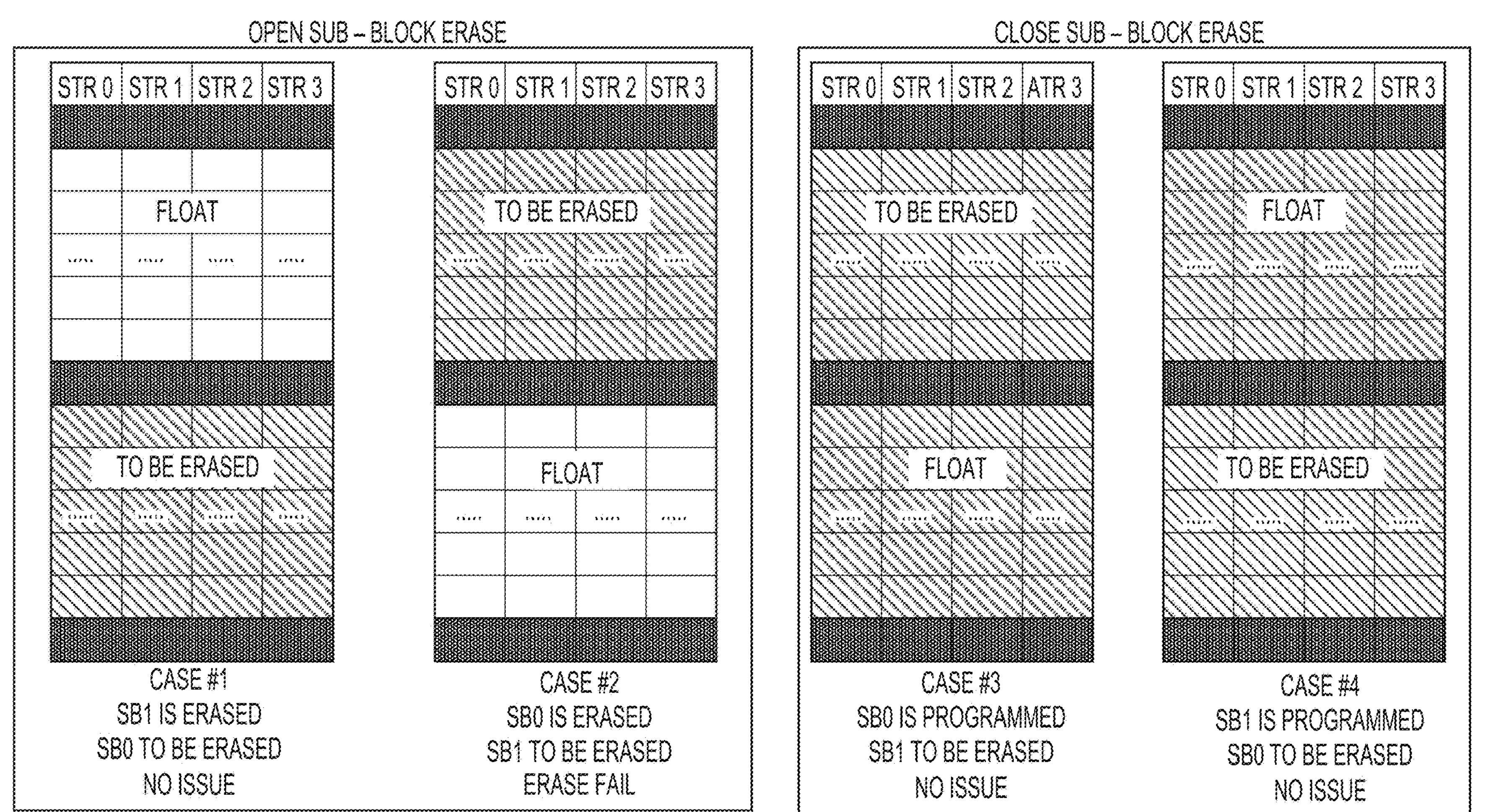
FIG. 7 shows a lower or first sub-block SB0 and an upper or second sub-block SB1 and illustrates four different scenarios of one of the sub-blocks being erased or programmed when the other of the sub-blocks will be erased in an erase operation according to aspects of the disclosure.
Figure 8:
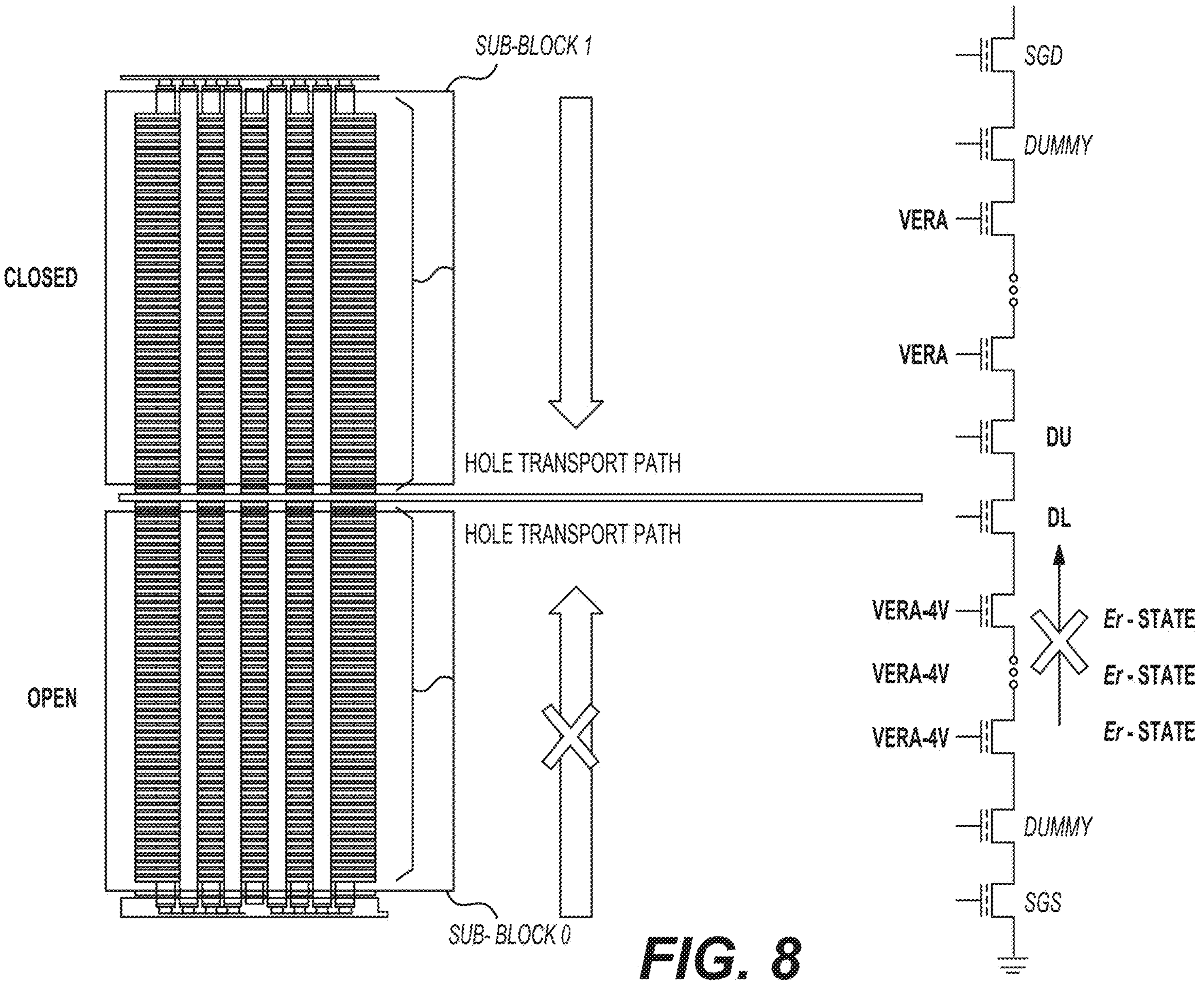
FIG. 8 is a diagram of a block of memory cells divided into two sub-blocks, sub-block 0 and sub-block 1 and illustrates a hole transport path for each sub-block during an erase operation according to aspects of the disclosure.

As discussed, an erase operation for the memory cells of one sub-block may be adversely affected depending on the erased or programmed state of the memory cells of another of the sub-blocks. FIG. 7 shows a lower or first sub-block SB0 and an upper or second sub-block SB1 and illustrates four different scenarios of one of the sub-blocks being erased or programmed (unselected) when the other of the sub-blocks (selected) will be erased in an erase operation. The four different scenarios are divided into open sub-block erase (left hand side of FIG. 7) and close sub-block erase (right hand side of FIG. 7) depending on the unselected sub-block being erased (open) or programmed (closed). Among the four different scenarios, the upper or second sub-block SB1 erase with the lower or first sub-block SB0 being open (i.e., the memory cells being erased) has the problem of erase failure. To enable open sub-block operation in sub-block mode (SBM), this problem needs to be solved. The cause of this sub-block erase problem is identified as the holes from a source side of each memory hole getting blocked by sub-block 0/SB0 cells that are in erase state. FIG. 8 is a diagram of a block of memory cells divided into two sub-blocks, sub-block 0 and sub-block 1 and illustrates a hole transport path for each sub-block during an erase operation. When the erase operation happens for SB1, holes are generated by gate-induced drain leakage (GIDL) from both the source and the drain side are needed to erase sub-block 1/SB1. When SB0 is in the open condition with all memory cells being in erase state, the threshold voltage Vt distribution is wide and many memory cells with their threshold voltage Vt lower than −4V, for example. When the erase happens on sub-block 1/SB1, a current bias (WLU1_ERA_SBM=VERA-4V) applied on a gate of SB0 word lines cannot turn on all memory cells and holes from source side are blocked (FIG. 8).

Figure 9:
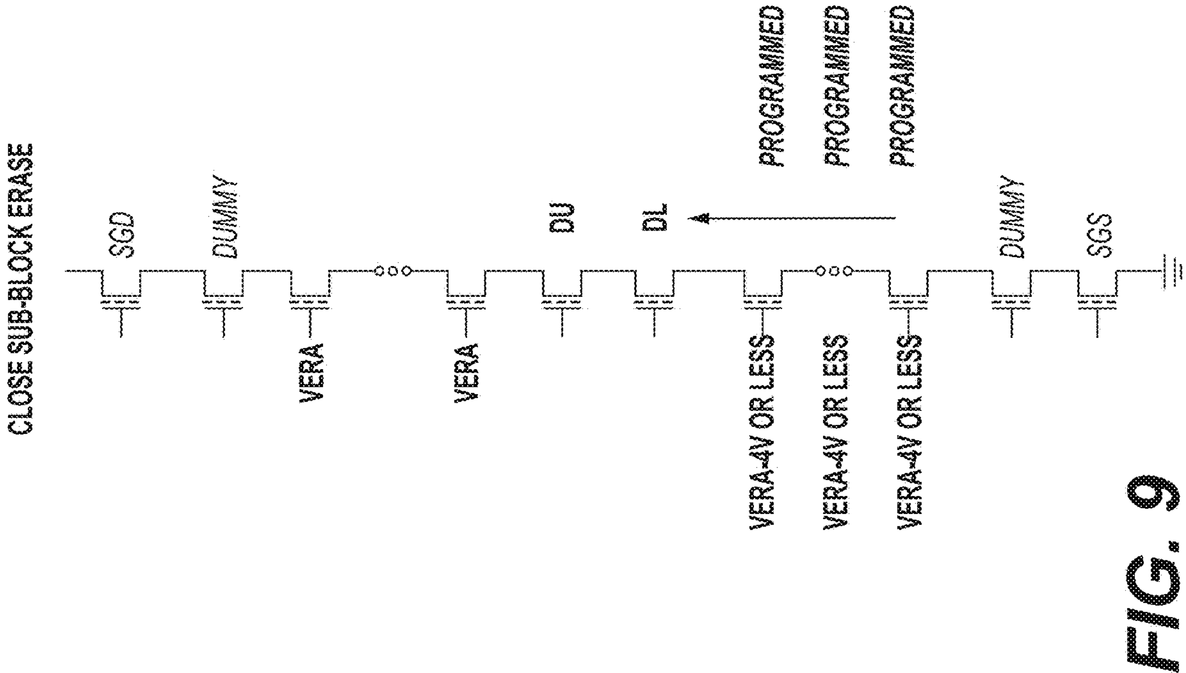
FIG. 9 shows a diagram of the memory cells in an example memory hole for close sub-block erase according to aspects of the disclosure.
Figure 10:
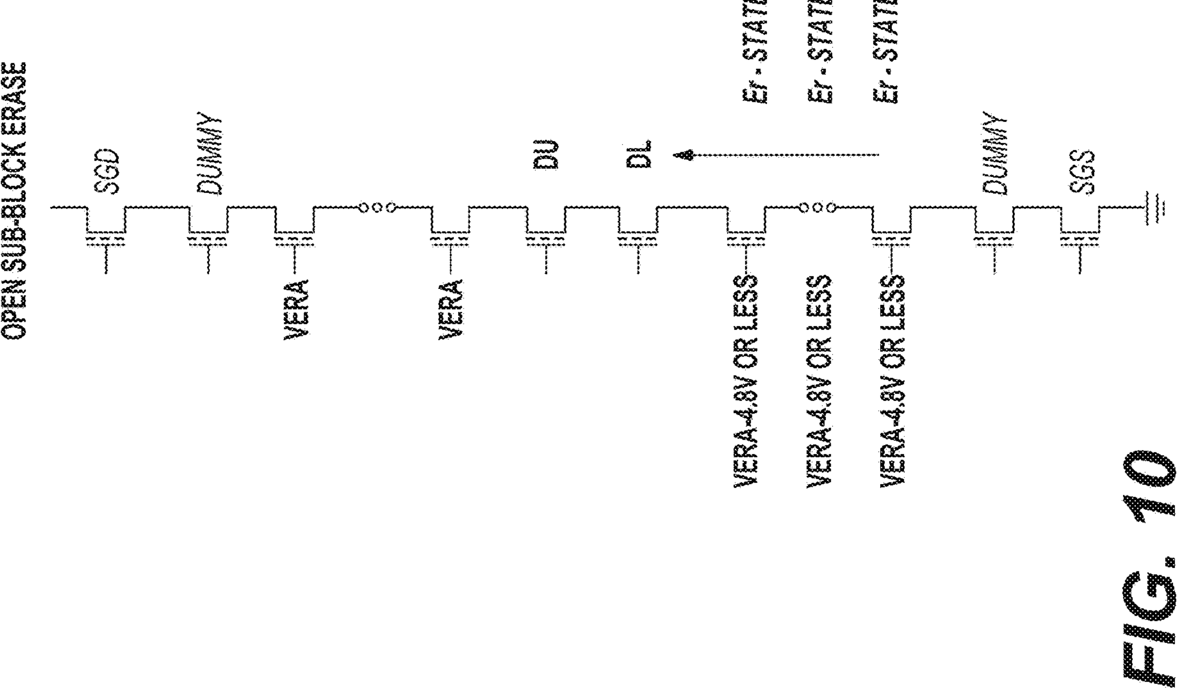
FIG. 10 shows a diagram of the memory cells in an example memory hole for open sub-block erase according to aspects of the disclosure.

Because of short channel effects in the memory cells, few cells (less than 8) in the erase state cannot block the hole transport and the erase operation is successful or good. When enough successive word lines are in erase state, the scenario is similar to the long channel case, the barrier for hole is high and cannot be punched though with short channel effect. With 101 or less word lines in SB0 being programmed (8 or more successive word lines being in erase state), the source side holes are blocked and SB1 erase loop number increases. For long channel cases, reducing the gate bias (WLU1_ERA_SBM) can lower the barrier for holes and helps hole transport. FIG. 9 shows a diagram of the memory cells in an example memory hole for close sub-block erase. For close sub-block erase, the gate bias WLU1_ERA_SBM needs to be VERA-4V or less to make sure no holes are blocked. The gate bias WLU1_ERA_SBM being higher than VERA-4V will cause an erase operation fail issue even in close sub-block scenarios. FIG. 10 shows a diagram of the memory cells in an example memory hole for open sub-block erase. For open sub-block erase, further reducing the gate bias WLU1_ERA_SBM to VERA-4.8V or beyond recovers the erase loop. By doing that, enough cells in SB0 can be turned on and the sub-block erase can be successful with 2 loops, for example. This demonstrates that holes are blocked by the erased cells if the overdrive bias is not enough to overcome the threshold voltage Vt of the erased cells.

Figures 11, 12:
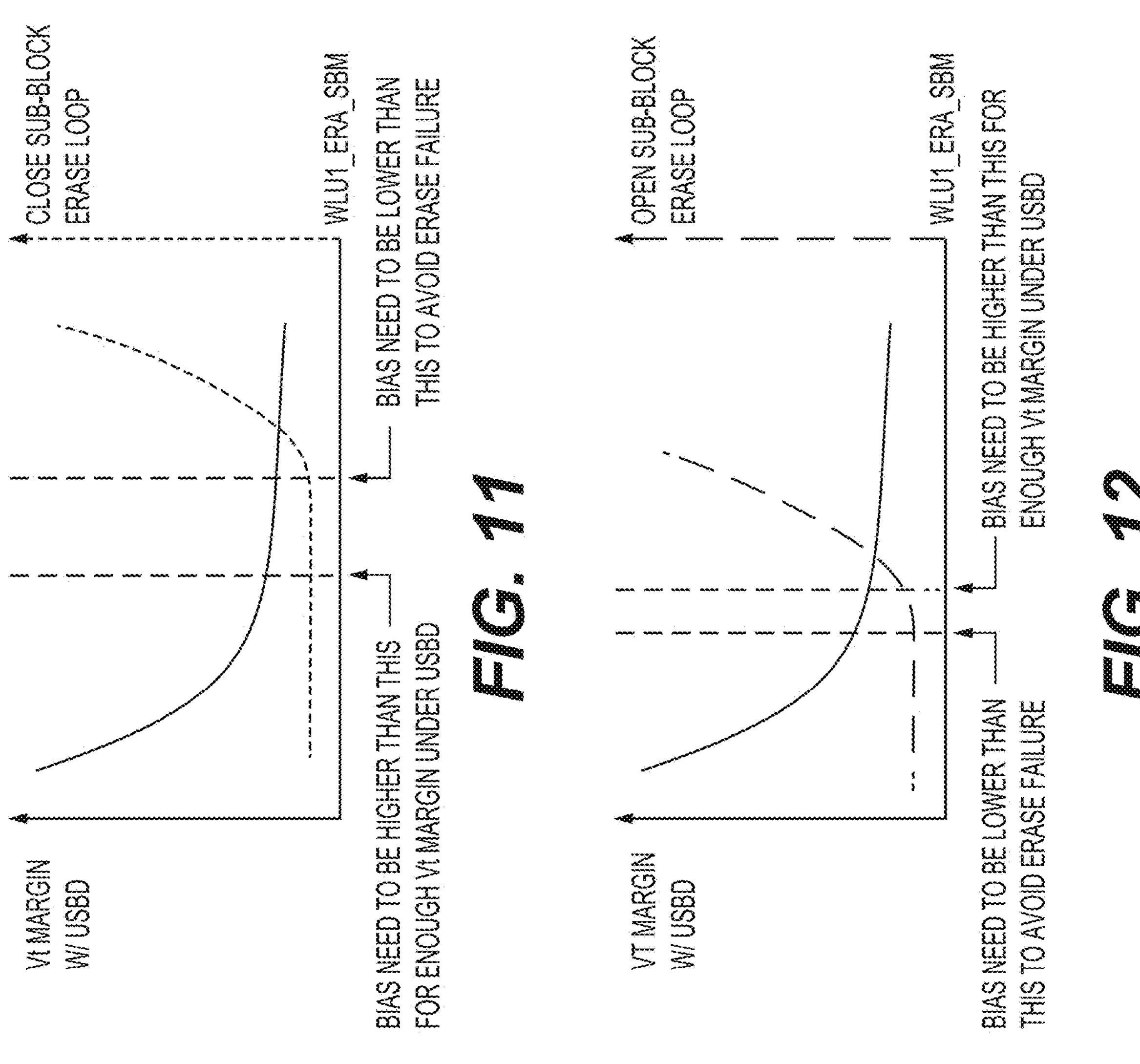
FIGS. 11 and 12 are plots of threshold voltage Vt margin of sub-block mode (SBM) under unselected sub-block disturb along with erase loops versus gate bias for close sub-block (FIG. 11) and open sub-block (FIG. 12) according to aspects of the disclosure.

Lower gate bias WLU1_ERA_SBM will induce more erase disturb to the unselected sub-block, causing lower G-state lower tail and threshold voltage Vt width widening, and reduce the threshold voltage Vt margin of SBM under unselected sub-block disturb (USBD). FIGS. 11 and 12 are plots of threshold voltage Vt margin of SBM under unselected sub-block disturb (USBD) along with erase loops versus gate bias WLU1_ERA_SBM for close sub-block (FIG. 11) and open sub-block (FIG. 12). Considering both erase disturb and erase failure requirements, for close sub-block erase, there is still margin for WLU1_ERA_SBM but no margin exists for open sub-block erase. Thus, it is desirable to solve the margin issue and enable open sub-block erase operation.

Consequently, described herein is a memory apparatus (e.g., storage system 100 of FIG. 1) including memory cells (e.g., memory cells 570-574 of FIG. 4D) configured to retain a transistor threshold voltage corresponding to a plurality of data states (e.g., transistor threshold voltage distributions shown in FIGS. 5A-5C). The memory cells form a block including an unselected sub-block for an erase operation (e.g., SB0 in Case #2 of FIG. 7) and a selected sub-block for the erase operation (e.g., SB1 in Case #2 of FIG. 7). The memory apparatus also includes a control circuit or means (e.g., one or any combination of memory controller 120 of FIG. 1, control circuitry 210, 220, system control logic 260, of FIG. 2A and so forth). The control means is configured to identify ones of the plurality of word lines of the unselected sub-block that are programmed. The control means is also configured to apply a selected erase enable voltage to ones of the plurality of word lines of the selected sub-block while applying an unselected erase enable voltage to ones of the plurality of word lines of the unselected sub-block to erase the memory cells of the selected sub-block during the erase operation. The unselected erase enable voltage is different for ones of the plurality of word lines of the unselected sub-block that are programmed (VERA-X) than for ones of the plurality of word lines of the unselected sub-block that are erased (VERA-Y).

As discussed above, the memory cells may be disposed in memory holes (memory hole MH of FIG. 4, vertical columns 422, 432, 442, 452, and 453 of FIGS. 4B-4D) extending vertically through a stack (e.g., stack 401 of FIG. 4) of the plurality of word lines (W in FIG. 4, WL0-WL269 in FIG. 4D). Thus, according to an aspect, the selected sub-block for the erase operation is disposed vertically above the unselected sub-block. Referring back to FIGS. 4 and 4C, for example, the plurality of word lines and a plurality of dielectric layers (D in FIG. 4) extend horizontally and overlay one another in an alternating fashion in the stack. The memory cells are connected in series between at least one drain-side select gate transistor (e.g., SGD0-SGD2 in FIG. 4C) on a drain-side of each of the memory holes and a source-side select gate transistor (e.g., SGS0-SGS2 in FIG. 4C) on a source-side of each of the memory holes. The at least one drain-side select gate transistor of each of the memory holes is coupled to one of a plurality of bit lines (e.g., bit line 414 of FIG. 4C) and the source-side select gate transistor of each of the memory holes is connected to a source line (e.g., source line SL of FIG. 4C). In addition, the plurality of word lines includes one or more dummy word lines disposed between the selected sub-block and the unselected sub-block (e.g., dummy word line layers DD0, DD1, WLIFDU, WLIDDL, DDS of FIG. 4C).

Figures 13, 14, 15:
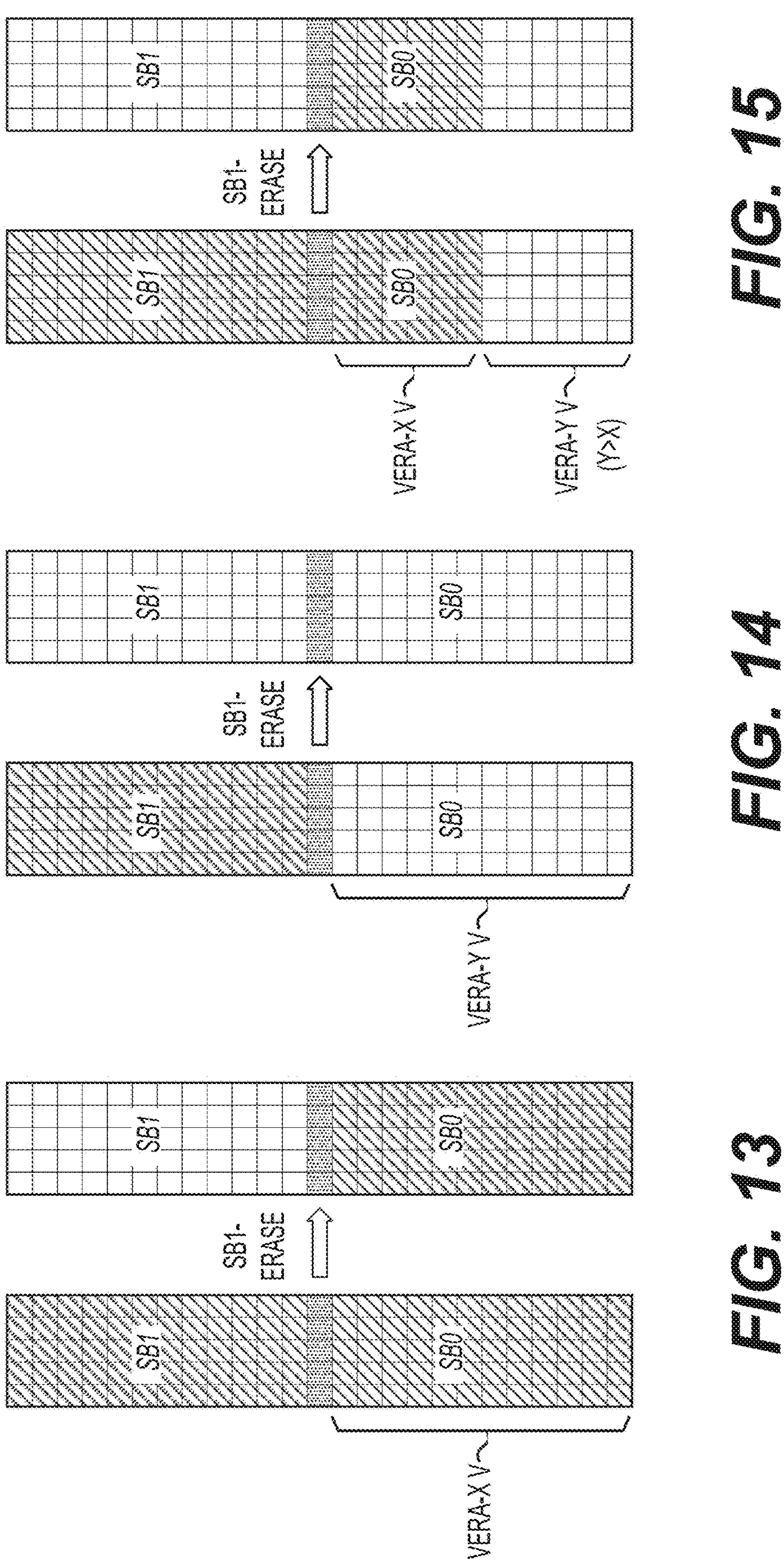
FIGS. 13-15 shows a lower or first sub-block SB0 and an upper or second sub-block SB1 right before erasing the upper or second sub-block SB1 when the lower or first sub-block SB0 is fully programmed (closed, FIG. 13), fully erased (open, FIG. 14), and partially programmed (FIG. 15) along with the unselected erase enable voltage applied to ones of the plurality of word lines of the unselected sub-block in each case according to aspects of the disclosure.

FIGS. 13-15 show a lower or first sub-block SB0 and an upper or second sub-block SB1 right before erasing the upper or second sub-block SB1 when the lower or first sub-block SB0 is fully programmed (closed, FIG. 13), fully erased (open, FIG. 14), and partially programmed (FIG. 15) along with the unselected erase enable voltage (VERA-X or VERA-Y) applied to ones of the plurality of word lines of the unselected sub-block in each case. Since the information about word lines being programmed or not can be known to the control means, then different biases (VERA-X or VERA-Y) can be designed to apply for programmed and erased word lines of the unselected sub-block (USB) during selected sub-block erase. So, for the unselected sub-block, as it can be open block case during erase, for any programmed word lines, VERA-X shall be applied, while for erased word lines, bias VERA-Y shall be applied.

According to an aspect, the unselected erase enable voltage applied to the ones of the plurality of word lines of the unselected sub-block that are programmed is greater than the unselected erase enable voltage applied to the ones of the plurality of word lines of the unselected sub-block that are erased. In other words, Y>X so that VERA-X turns on all programmed word lines and VERA-Y turns on all programmed word lines in erase state. No extra erase disturb will be introduced to programmed word lines. With such a technique, some of the restrictions for the control means to use the SBM can be lifted and make SBM a more practical mode.

Figure 16:
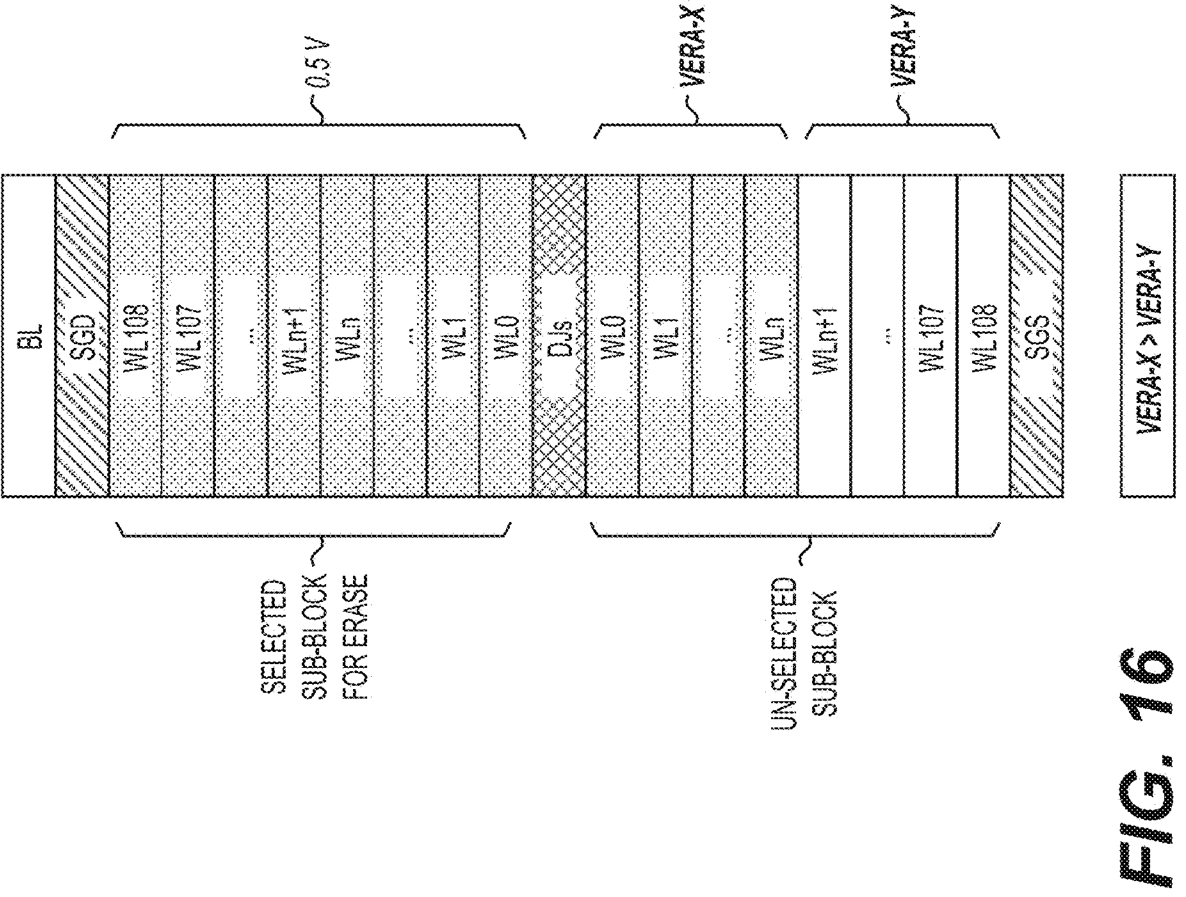
FIG. 16 is a diagram showing word lines of the selected and unselected sub-blocks along with the unselected erase enable voltage applied to ones of the plurality of word lines of the unselected sub-block based on whether the memory cells connected thereto are programmed or erased according to aspects of the disclosure.
Figure 17:
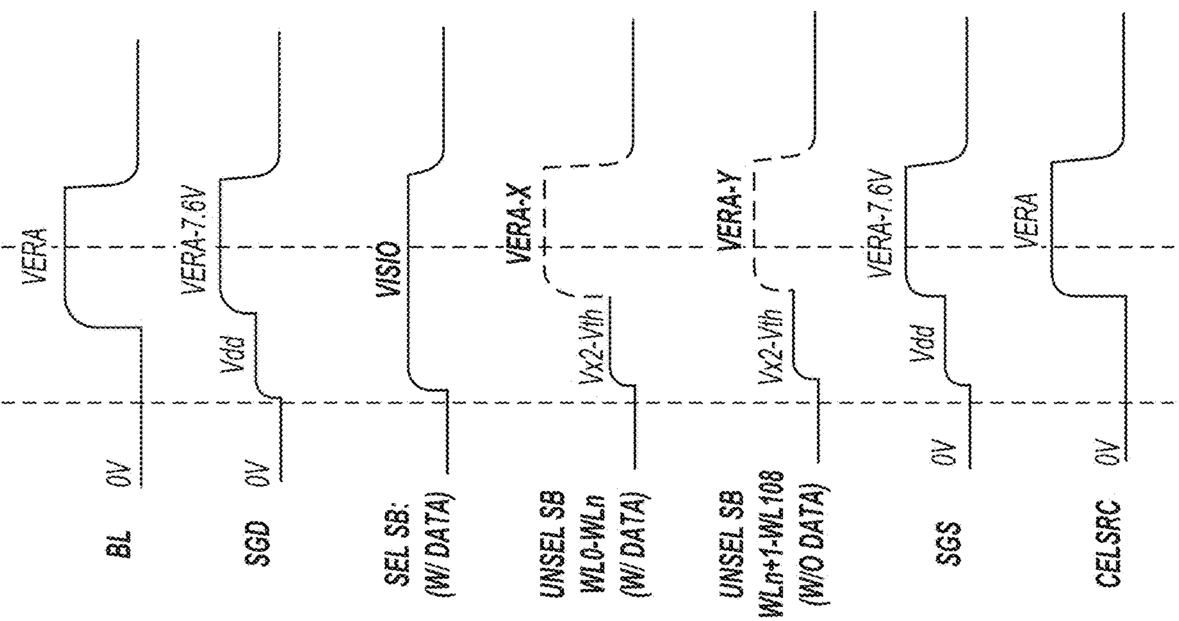
FIG. 17 is an example plot of voltages or biases applied to the bit lines, drain-side select gate transistor SGD, word lines of the selected sub-block SEL SB with data, unselected sub-block with data, unselected sub-block without data, source-side select gate transistor (SGS), and source line (CELSRC) during the erase operation of the selected sub-block according to aspects of the disclosure.

FIG. 16 is a diagram showing word lines of the selected and unselected sub-blocks along with the unselected erase enable voltage (VERA-X or VERA-Y) applied to ones of the plurality of word lines of the unselected sub-block based on whether the memory cells connected thereto are programmed or erased. FIG. 17 is an example plot of voltages or biases applied to the bit lines, drain-side select gate transistor SGD, word lines of the selected sub-block SEL SB with data, unselected sub-block with data (i.e., programmed), unselected sub-block without data (i.e., erased), source-side select gate transistor (SGS), and source line (CELSRC) during the erase operation of the selected sub-block. As shown, the selected erase enable voltage is an isolation voltage VISO, the unselected erase enable voltage includes a programmed unselected erase enable voltage VERA-X and an erased unselected erase enable voltage VERA-Y. So according to an aspect, the control means is further configured, while applying the unselected erase enable voltage to ones of the plurality of word lines of the unselected sub-block, to apply an erase voltage VERA to ones of the plurality of bit lines coupled to the memory cells being erased. The control means is additionally configured to apply a select gate erase enable voltage VERA-7.6V to the at least one drain-side select gate transistor of the memory holes with the memory cells being erased. The control means also applies the isolation voltage VISO to ones of the plurality of word lines of the selected sub-block. The control means is further configured to apply the programmed unselected erase enable voltage VERA-X to ones of the plurality of word lines of the unselected sub-block that are programmed. The control means applies the erased unselected erase enable voltage VERA-Y to ones of the plurality of word lines of the unselected sub-block that are erased. In addition, the control means is configured to apply the select gate erase enable voltage VERA-7.6V to the at least one source-side select gate transistor of the memory holes with the memory cells being erased. The control means is also configured to apply the erase voltage VERA to the source line coupled to the memory holes with the memory cells being erased.

Accordingly, the plurality of word lines can include a boundary word line (e.g., WLn of the unselected sub-block of FIG. 16) demarcating a boundary between ones of the plurality of word lines of the unselected sub-block that are programmed and ones of the plurality of word lines of the unselected sub-block that are erased. Thus, according to an aspect, the control means is further configured to start the erase operation and determine whether the memory cells of the unselected sub-block are programmed and find the boundary word line of the unselected sub-block. The control means is additionally configured to apply the programmed unselected erase enable voltage VERA-X to ones of the plurality of word lines of the unselected sub-block on a first side of and including the boundary word line. In addition, the control means is configured to apply the erased unselected erase enable voltage VERA-Y to ones of the plurality of word lines of the unselected sub-block on a second side of the boundary word line opposite the first side. The control means is also configured to finish the erase operation using the programmed unselected erase enable voltage VERA-X and the erased unselected erase enable voltage VERA-Y for the unselected sub-block. According to a further aspect, the control means is further configured to read at least some of the memory cells of the unselected sub-block at a predetermined binary search read level in a binary search operation to find the boundary word line of the unselected sub-block.

Figure 18:
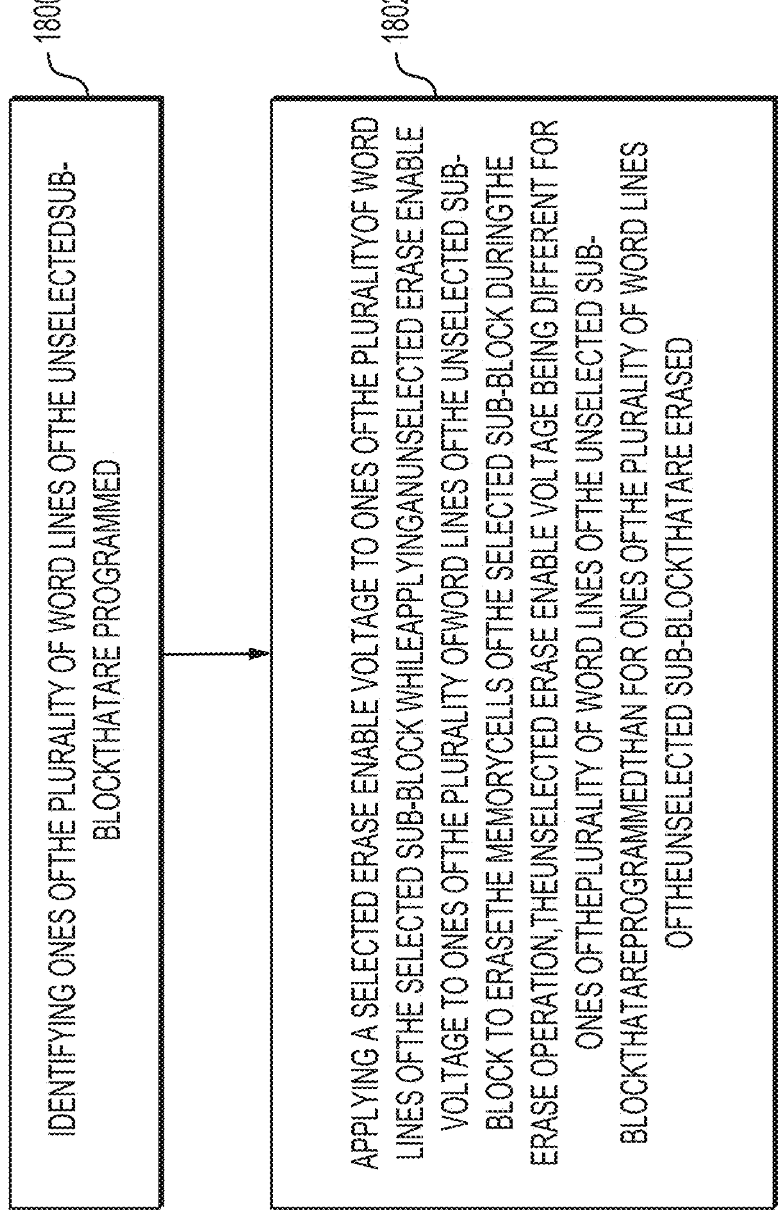
FIGS. 18 and 19 illustrate steps of a method of operating a memory apparatus according to aspects of the disclosure.
Figure 19:
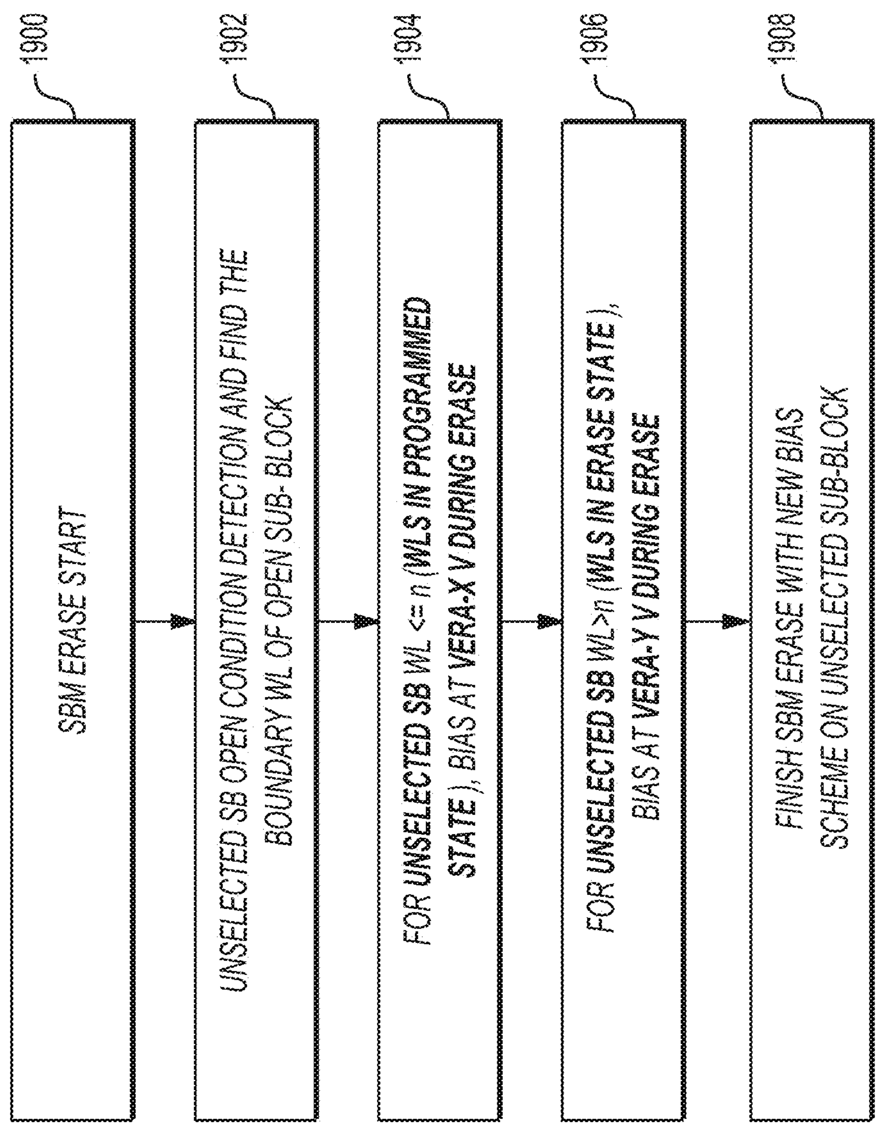

FIGS. 18-19 illustrate steps of a method of operating a memory apparatus. As discussed above, the memory apparatus (e.g., storage system 100 of FIG. 1) includes memory cells (e.g., memory cells 570-574 of FIG. 4D) configured to retain a transistor threshold voltage corresponding to a plurality of data states (e.g., transistor threshold voltage distributions shown in FIGS. 5A-5C). The memory cells form a block including an unselected sub-block for an erase operation (e.g., SB0 in Case #2 of FIG. 7) and a selected sub-block for the erase operation (e.g., SB1 in Case #2 of FIG. 7). Referring initially to FIG. 18, the method includes the step of 1800 identifying ones of the plurality of word lines of the unselected sub-block that are programmed. The method also includes the step of 1802 applying a selected erase enable voltage to ones of the plurality of word lines of the selected sub-block while applying an unselected erase enable voltage to ones of the plurality of word lines of the unselected sub-block to erase the memory cells of the selected sub-block during the erase operation. The unselected erase enable voltage is different for ones of the plurality of word lines of the unselected sub-block that are programmed (VERA-X) than for ones of the plurality of word lines of the unselected sub-block that are erased (VERA-Y).

Once again, the memory cells may be disposed in memory holes (memory hole MH of FIG. 4, vertical columns 422, 432, 442, 452, and 453 of FIGS. 4B-4D) extending vertically through a stack (e.g., stack 401 of FIG. 4) of the plurality of word lines (W in FIG. 4, WL0-WL269 in FIG. 4D). Therefore, according to an aspect, the selected sub-block for the erase operation is disposed vertically above the unselected sub-block. Again referring back to FIGS. 4 and 4C, for example, the plurality of word lines and a plurality of dielectric layers (D in FIG. 4) extend horizontally and overlay one another in an alternating fashion in the stack. The memory cells are connected in series between at least one drain-side select gate transistor (e.g., SGD0-SGD2 in FIG. 4C) on a drain-side of each of the memory holes and a source-side select gate transistor (e.g., SGS0-SGS2 in FIG. 4C) on a source-side of each of the memory holes. The at least one drain-side select gate transistor of each of the memory holes is coupled to one of a plurality of bit lines (e.g., bit line 414 of FIG. 4C) and the source-side select gate transistor of each of the memory holes is connected to a source line (e.g., source line SL of FIG. 4C). Furthermore, the plurality of word lines includes one or more dummy word lines disposed between the selected sub-block and the unselected sub-block (e.g., dummy word line layers DD0, DD1, WLIFDU, WLIDDL, DDS of FIG. 4C).

Again, the unselected erase enable voltage applied to the ones of the plurality of word lines of the unselected sub-block that are programmed is greater than the unselected erase enable voltage applied to the ones of the plurality of word lines of the unselected sub-block that are erased.

As discussed above and according to an aspect, the selected erase enable voltage is an isolation voltage VISO, the unselected erase enable voltage includes a programmed unselected erase enable voltage VERA-X and an erased unselected erase enable voltage VERA-Y. Thus, the method can further include the step, while applying the unselected erase enable voltage to ones of the plurality of word lines of the unselected sub-block, of applying an erase voltage VERA to ones of the plurality of bit lines coupled to the memory cells being erased. The method may additionally include the step of applying a select gate erase enable voltage VERA-7.6V to the at least one drain-side select gate transistor of the memory holes with the memory cells being erased. The method can further include the step of applying the isolation voltage VISO to ones of the plurality of word lines of the selected sub-block. In addition, the method may include the step of applying the programmed unselected erase enable voltage VERA-X to ones of the plurality of word lines of the unselected sub-block that are programmed. The method can additionally include the step of applying the erased unselected erase enable voltage VERA-Y to ones of the plurality of word lines of the unselected sub-block that are erased. Additionally, the method may include the step of applying the select gate erase enable voltage VERA-7.6V to the at least one source-side select gate transistor of the memory holes with the memory cells being erased. The method can also include the step of applying the erase voltage VERA to the source line coupled to the memory holes with the memory cells being erased.

Again, the plurality of word lines can include a boundary word line (e.g., WLn of the unselected sub-block of FIG. 16) demarcating a boundary between ones of the plurality of word lines of the unselected sub-block that are programmed and ones of the plurality of word lines of the unselected sub-block that are erased. Therefore, according to an aspect, referring specifically to FIG. 19, the method further includes the steps of 1900 starting the erase operation and 1902 determining whether the memory cells of the unselected sub-block are programmed and find the boundary word line of the unselected sub-block. Next, 1904 applying the programmed unselected erase enable voltage VERA-X to ones of the plurality of word lines of the unselected sub-block on a first side of (e.g., vertically above) and including the boundary word line. The method proceeds by 1906 applying the erased unselected erase enable voltage VERA-Y to ones of the plurality of word lines of the unselected sub-block on a second side of (e.g., vertically below) the boundary word line opposite the first side. The next step of the method is 1908 finishing the erase operation using the programmed unselected erase enable voltage VERA-X and the erased unselected erase enable voltage VERA-Y for the unselected sub-block. According to a further aspect, the method may further include the step of reading at least some of the memory cells of the unselected sub-block at a predetermined binary search read level in a binary search operation to find the boundary word line of the unselected sub-block.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A memory apparatus, comprising:

memory cells each connected to one of a plurality of word lines and configured to retain a threshold voltage corresponding to one of a plurality of data states, the memory cells form a block including an unselected sub-block for an erase operation and a selected sub-block for the erase operation; and a control means configured to:

identify ones of the plurality of word lines of the unselected sub-block that are programmed, and apply a selected erase enable voltage to ones of the plurality of word lines of the selected sub-block while applying an unselected erase enable voltage to ones of the plurality of word lines of the unselected sub-block to erase the memory cells of the selected sub-block during the erase operation, the unselected erase enable voltage being different for ones of the plurality of word lines of the unselected sub-block that are programmed than for ones of the plurality of word lines of the unselected sub-block that are erased.

2. The memory apparatus as set forth in claim 1, wherein the unselected erase enable voltage applied to the ones of the plurality of word lines of the unselected sub-block that are programmed is greater than the unselected erase enable voltage applied to the ones of the plurality of word lines of the unselected sub-block that are erased.

3. The memory apparatus as set forth in claim 1, wherein the memory cells disposed in memory holes extending vertically through a stack of the plurality of word lines, the selected sub-block for the erase operation is disposed vertically above the unselected sub-block.

4. The memory apparatus as set forth in claim 3, wherein the plurality of word lines and a plurality of dielectric layers extend horizontally and overlay one another in an alternating fashion in the stack, the memory cells are connected in series between at least one drain-side select gate transistor on a drain-side of each of the memory holes and at least one source-side select gate transistor on a source-side of each of the memory holes, the at least one drain-side select gate transistor of each of the memory holes is coupled to one of a plurality of bit lines and the source-side select gate transistor of each of the memory holes is connected to a source line, the plurality of word lines includes one or more dummy word lines disposed between the selected sub-block and the unselected sub-block.

5. The memory apparatus as set forth in claim 4, wherein the selected erase enable voltage is an isolation voltage, the unselected erase enable voltage includes a programmed unselected erase enable voltage and an erased unselected erase enable voltage, and the control means is further configured, while applying the unselected erase enable voltage to ones of the plurality of word lines of the unselected sub-block, to:
  apply an erase voltage to ones of the plurality of bit lines coupled to the memory cells being erased;
  apply a select gate erase enable voltage to the at least one drain-side select gate transistor of the memory holes with the memory cells being erased;
  apply the isolation voltage to ones of the plurality of word lines of the selected sub-block;
  apply the programmed unselected erase enable voltage to ones of the plurality of word lines of the unselected sub-block that are programmed;
  apply the erased unselected erase enable voltage to ones of the plurality of word lines of the unselected sub-block that are erased;
  apply the select gate erase enable voltage to the at least one source-side select gate transistor of the memory holes with the memory cells being erased; and
  apply the erase voltage to the source line coupled to the memory holes with the memory cells being erased.

6. The memory apparatus as set forth in claim 3, wherein the unselected erase enable voltage includes a programmed unselected erase enable voltage and an erased unselected erase enable voltage, the plurality of word lines includes a boundary word line demarcating a boundary between ones of the plurality of word lines of the unselected sub-block that are programmed and ones of the plurality of word lines of the unselected sub-block that are erased, and the control means is further configured to:
  start the erase operation;
  determine whether the memory cells of the unselected sub-block are programmed and find the boundary word line of the unselected sub-block;
  apply the programmed unselected erase enable voltage to ones of the plurality of word lines of the unselected sub-block on a first side of and including the boundary word line;
  apply the erased unselected erase enable voltage to ones of the plurality of word lines of the unselected sub-block on a second side of the boundary word line opposite the first side; and
  finish the erase operation using the programmed unselected erase enable voltage and the erased unselected erase enable voltage for the unselected sub-block.

7. The memory apparatus as set forth in claim 6, wherein the control means is further configured to read at least some of the memory cells of the unselected sub-block at a predetermined binary search read level in a binary search operation to find the boundary word line of the unselected sub-block.

8. A controller in communication with a memory apparatus including memory cells each connected to one of a plurality of word lines and configured to retain a threshold voltage corresponding to one of a plurality of data states, the memory cells form a block including an unselected sub-block for an erase operation and a selected sub-block for the erase operation, the controller configured to:
  identify ones of the plurality of word lines of the unselected sub-block that are programmed, and
  instruct the memory apparatus to apply a selected erase enable voltage to ones of the plurality of word lines of the selected sub-block while applying an unselected erase enable voltage to ones of the plurality of word lines of the unselected sub-block to erase the memory cells of the selected sub-block during the erase operation, the unselected erase enable voltage being different for ones of the plurality of word lines of the unselected sub-block that are programmed than for ones of the plurality of word lines of the unselected sub-block that are erased.

9. The controller as set forth in claim 8, wherein the unselected erase enable voltage applied to the ones of the plurality of word lines of the unselected sub-block that are programmed is greater than the unselected erase enable voltage applied to the ones of the plurality of word lines of the unselected sub-block that are erased.

10. The controller as set forth in claim 8, wherein the memory cells disposed in memory holes extending vertically through a stack of the plurality of word lines, the selected sub-block for the erase operation is disposed vertically above the unselected sub-block.

11. The controller as set forth in claim 10, wherein the plurality of word lines and a plurality of dielectric layers extend horizontally and overlay one another in an alternating fashion in the stack, the memory cells are connected in series between at least one drain-side select gate transistor on a drain-side of each of the memory holes and at least one source-side select gate transistor on a source-side of each of the memory holes, the at least one drain-side select gate transistor of each of the memory holes is coupled to one of a plurality of bit lines and the source-side select gate transistor of each of the memory holes is connected to a source line, the plurality of word lines includes one or more dummy word lines disposed between the selected sub-block and the unselected sub-block.

12. The controller as set forth in claim 11, wherein the selected erase enable voltage is an isolation voltage, the unselected erase enable voltage includes a programmed unselected erase enable voltage and an erased unselected erase enable voltage, and the controller is further configured, while applying the unselected erase enable voltage to ones of the plurality of word lines of the unselected sub-block, to:
  instruct the memory apparatus to apply an erase voltage to ones of the plurality of bit lines coupled to the memory cells being erased;
  instruct the memory apparatus to apply a select gate erase enable voltage to the at least one drain-side select gate transistor of the memory holes with the memory cells being erased;

instruct the memory apparatus to apply the isolation voltage to ones of the plurality of word lines of the selected sub-block;

instruct the memory apparatus to apply the programmed unselected erase enable voltage to ones of the plurality of word lines of the unselected sub-block that are programmed;

instruct the memory apparatus to apply the erased unselected erase enable voltage to ones of the plurality of word lines of the unselected sub-block that are erased;

instruct the memory apparatus to apply the select gate erase enable voltage to the at least one source-side select gate transistor of the memory holes with the memory cells being erased; and instruct the memory apparatus to apply the erase voltage to the source line coupled to the memory holes with the memory cells being erased.

13. The controller as set forth in claim 10, wherein the unselected erase enable voltage includes a programmed unselected erase enable voltage and an erased unselected erase enable voltage, the plurality of word lines includes a boundary word line demarcating a boundary between ones of the plurality of word lines of the unselected sub-block that are programmed and ones of the plurality of word lines of the unselected sub-block that are erased, and the controller is further configured to:

start the erase operation;

determine whether the memory cells of the unselected sub-block are programmed and find the boundary word line of the unselected sub-block;

instruct the memory apparatus to apply the programmed unselected erase enable voltage to ones of the plurality of word lines of the unselected sub-block on a first side of and including the boundary word line;

instruct the memory apparatus to apply the erased unselected erase enable voltage to ones of the plurality of word lines of the unselected sub-block on a second side of the boundary word line opposite the first side; and instruct the memory apparatus to finish the erase operation using the programmed unselected erase enable voltage and the erased unselected erase enable voltage for the unselected sub-block.

14. A method of operating a memory apparatus including memory cells each connected to one of a plurality of word lines and configured to retain a threshold voltage corresponding to one of a plurality of data states, the memory cells form a block including an unselected sub-block for an erase operation and a selected sub-block for the erase operation, the method comprising the steps of:

identifying ones of the plurality of word lines of the unselected sub-block that are programmed; and applying a selected erase enable voltage to ones of the plurality of word lines of the selected sub-block while applying an unselected erase enable voltage to ones of the plurality of word lines of the unselected sub-block to erase the memory cells of the selected sub-block during the erase operation, the unselected erase enable voltage being different for ones of the plurality of word lines of the unselected sub-block that are programmed than for ones of the plurality of word lines of the unselected sub-block that are erased.

15. The method as set forth in claim 14, wherein the unselected erase enable voltage applied to the ones of the plurality of word lines of the unselected sub-block that are programmed is greater than the unselected erase enable voltage applied to the ones of the plurality of word lines of the unselected sub-block that are erased.

16. The method as set forth in claim 14, wherein the memory cells disposed in memory holes extending vertically through a stack of the plurality of word lines, the selected sub-block for the erase operation is disposed vertically above the unselected sub-block.

17. The method as set forth in claim 16, wherein the plurality of word lines and a plurality of dielectric layers extend horizontally and overlay one another in an alternating fashion in the stack, the memory cells are connected in series between at least one drain-side select gate transistor on a drain-side of each of the memory holes and at least one source-side select gate transistor on a source-side of each of the memory holes, the at least one drain-side select gate transistor of each of the memory holes is coupled to one of a plurality of bit lines and the source-side select gate transistor of each of the memory holes is connected to a source line, the plurality of word lines includes one or more dummy word lines disposed between the selected sub-block and the unselected sub-block.

18. The method as set forth in claim 17, wherein the selected erase enable voltage is an isolation voltage, the unselected erase enable voltage includes a programmed unselected erase enable voltage and an erased unselected erase enable voltage, and the method further includes the steps, while applying the unselected erase enable voltage to ones of the plurality of word lines of the unselected sub-block, of:

applying an erase voltage to ones of the plurality of bit lines coupled to the memory cells being erased;

applying a select gate erase enable voltage to the at least one drain-side select gate transistor of the memory holes with the memory cells being erased;

applying the isolation voltage to ones of the plurality of word lines of the selected sub-block;

applying the programmed unselected erase enable voltage to ones of the plurality of word lines of the unselected sub-block that are programmed;

applying the erased unselected erase enable voltage to ones of the plurality of word lines of the unselected sub-block that are erased;

applying the select gate erase enable voltage to the at least one source-side select gate transistor of the memory holes with the memory cells being erased; and applying the erase voltage to the source line coupled to the memory holes with the memory cells being erased.

19. The method as set forth in claim 16, wherein the unselected erase enable voltage includes a programmed unselected erase enable voltage and an erased unselected erase enable voltage, the plurality of word lines includes a boundary word line demarcating a boundary between ones of the plurality of word lines of the unselected sub-block that are programmed and ones of the plurality of word lines of the unselected sub-block that are erased, and the method further includes the steps of:

starting the erase operation;

determining whether the memory cells of the unselected sub-block are programmed and find the boundary word line of the unselected sub-block;

applying the programmed unselected erase enable voltage to ones of the plurality of word lines of the unselected sub-block on a first side of and including the boundary word line;

applying the erased unselected erase enable voltage to ones of the plurality of word lines of the unselected sub-block on a second side of the boundary word line opposite the first side; and finishing the erase operation using the programmed unselected erase enable voltage and the erased unselected erase enable voltage for the unselected sub-block.

20. The method as set forth in claim 19, further including the step of reading at least some of the memory cells of the unselected sub-block at a predetermined binary search read level in a binary search operation to find the boundary word line of the unselected sub-block.

* * * * *